(12) United States Patent
Falivene Aldea et al.

(10) Patent No.: US 11,163,093 B2
(45) Date of Patent: Nov. 2, 2021

(54) CONSTRUCTING STRATIGRAPHIC IMAGES OF SEDIMENT DISTRIBUTION IN A SUBSURFACE OF THE EARTH

(71) Applicant: SHELL OIL COMPANY, Houston, TX (US)

(72) Inventors: Oriol Falivene Aldea, Rijswijk (NL); Alessandro Frascati, Rijswijk (NL); Michele Bolla Pittaluga, Rijswijk (NL); Russell David Potter, Houston, TX (US); Thomas Patrick Etienne Krayenbuehl, Rijswijk (NL)

(73) Assignee: SHELL OIL COMPANY, Houston, TX (US)

( * ) Notice: Subject to any disclaimer, the term of this patent is extended or adjusted under 35 U.S.C. 154(b) by 711 days.

(21) Appl. No.: 15/978,943

(22) Filed: May 14, 2018

(65) Prior Publication Data

US 2018/0275312 A1    Sep. 27, 2018

Related U.S. Application Data

(63) Continuation of application No. PCT/US2018/021299, filed on Mar. 7, 2018.
(Continued)

(30) Foreign Application Priority Data

Mar. 23, 2017  (EP) .................................... 17162590

(51) Int. Cl.
*G06G 7/50*     (2006.01)
*G01V 99/00*   (2009.01)
(Continued)

(52) U.S. Cl.
CPC ............ *G01V 99/005* (2013.01); *G01V 1/282* (2013.01); *G01V 1/308* (2013.01); *G06F 30/20* (2020.01); *G01V 2210/661* (2013.01)

(58) Field of Classification Search
CPC .. G01V 99/005; G01V 1/282; G01V 2210/66; G01V 2210/661; G01V 1/301;
(Continued)

(56) References Cited

U.S. PATENT DOCUMENTS 5,844,799 A     12/1998  Joseph et al.
6,246,963 B1    6/2001   Cross et al.
(Continued)

FOREIGN PATENT DOCUMENTS

WO    2013092663 A2    6/2013

OTHER PUBLICATIONS

Granjeon 3D Forward Modelling of the Impact of Sediment Transport and Base Level Cycles On Continental Margins and Incised Valleys Int. Assoc. Sedimentol. Publ., 2014 (46), pp. 453-472 (Year: 2014).*

(Continued)

*Primary Examiner* — Rehana Perveen
*Assistant Examiner* — Cuong V Luu
(74) *Attorney, Agent, or Firm* — Shell Oil Company

(57) ABSTRACT

A distribution of sand sediment class in a subsurface of the Earth is identified. Three-dimensional stratigraphic images of sediment distribution in a subsurface of the Earth are constructed, including at least two depositional domains, by simulating sediment transport and deposition over a selected time interval of sediments originating from one or more clastic sediment input sources. The simulation uses at least two equilibrium surfaces bounding the at least two depositional domains and at least two sediment classes, and updates the equilibrium surfaces in a sequence of timesteps,
(Continued)

by accounting for sediment feed from the one or more clastic sediment input sources, erosion and deposition in accordance with mass-balance equality constraints. The images are used to identify a distribution of sand sediment class in the subsurface of the Earth suitable for acquiring hydrocarbons or fresh water, or for storing gas or liquids.

19 Claims, 20 Drawing Sheets

Related U.S. Application Data

(60) Provisional application No. 62/469,061, filed on Mar. 9, 2017.

(51) Int. Cl.
  *G06F 30/20* (2020.01)
  *G01V 1/28* (2006.01)
  *G01V 1/30* (2006.01)

(58) Field of Classification Search
  CPC ............... G01V 2210/64; G01V 1/28; G01V 2210/665; G01V 1/34; G01V 1/345; G06T 17/05
  See application file for complete search history.

(56) References Cited

U.S. PATENT DOCUMENTS

| | | | |
|---|---|---|---|
| 6,754,588 | B2 | 6/2004 | Cross et al. |
| 7,043,367 | B2 | 5/2006 | Granjeon |
| 2003/0144796 | A1* | 7/2003 | Anstey .................. G01V 1/50 702/8 |
| 2011/0290478 | A1* | 12/2011 | Sun ...................... G01V 99/00 166/250.01 |
| 2013/0132047 | A1 | 5/2013 | Granjeon |
| 2017/0107797 | A1* | 4/2017 | Ghayour ............... G06F 17/10 |

OTHER PUBLICATIONS

Meriam et al. Geologic Modeling and Simulation Sedimentary Systems 2001, Springer-Science + Business Media, LLC (Year: 2001).*
Lawrence et al., "Stratigraphic simulation of sedimentary basins—concepts and calibration", Mar. 1990, AAPG Bulletin, vol. 74, issue No. 3, pp. 273-295.
Aigner et al., "Stratigraphic modeling of epicontinental basins: two applications", Sedimentary Geology, 1990, vol. 69, pp. 167-190.
Lawrence, "Evaluation of eustasy, subsidence, and sediment input as controls on depositional sequence geometries and synchroneity of sequence boundaries", 1993, AAPG, special vol. M58.
Shuster et al., "Two-dimensional synthetic seismic and log cross sections from stratigraphic forward models", 1994, AAPG Bulletin, vol. 78, pp. 409-431.
Strobel et al.,"Interactive (SEDPAK) simulation of clastic and carbonate sediments in shelf to basin settings", Computers and Geosciences, 1989, vol. 15, pp. 1279-1290.
Kendall et al., "Simulation of the sedimentary fill of basins", Sedimentary modeling: Computer simulations and methods for improved parameter definition, Kansas Geological Survey Bulletin, 1991, vol. 233, pp. 9-30.
Frohlich et al., "STRATA-VARIOUS: A flexible Fortran program for dynamic forward modeling of stratigraphy", Sedimentary Modeling: Computer simulations and methods for improved parameter definition, Kansas Geological Survey Bulletin, 1991, vol. 233, pp. 449-461.
Ross et al., "Insights from Stratigraphic Modeling: Mud-Limited Versus Sand-Limited Depositional Systems", 1995, AAPG Bulletin, vol. 79, pp. 231-258.
Bowman et al., "Interpreting the sequence stratigraphy of the Baltimore canyon section, offshore New Jersey with PHIL, a stratigraphic simulator", Numerical Experiments in Stratigraphy: Recent Advances in Stratigraphic and Sedimentologic Computer Simulations, 1999, SEPM special publication, vol. 62, pp. 117-138.
Cowell et al., "Simulating Coastal Systems Tracts Using the Shoreface Translation Model", Numerical Experiments in Stratigraphy: Recent Advances in Stratigraphic and Sedimentologic Computer Simulations, 1999, SEPM special publication, vol. 62.
Ulciny et al., "Role of initial depth at basin margins in sequence architecture: field examples and computer models", Basin Research, 2002, vol. 14, pp. 347-360.
Kenyon et al., "Morphology of a delta prograding by bulk sediment transport", Geological Society of America Bulletin, 1985, vol. 96, pp. 1457-1465.
Jordan et al., "Large-scale stratigraphic architecture, eustatic variation, and unsteady tectonism: A theoretical evaluation", Journal of Geophysical Research, 1991, vol. 96, pp. 6681-6699.
Kaufman et al., "Depth-dependent diffusion algorithm for simulation of sedimentation in shallow marine depositional systems", Sedimentary Modeling: Computer simulations and methods for improved parameter definition, 1991, Kansas Geological Survey Bulletin, vol. 233, pp. 489-508.
Paola et al., "The large-scale dynamics of grain-size variations in alluvial basins, 1: Theory", Basin Research, Jun. 1992, vol. 4, pp. 73-90.
Rivenaes et al., "Application of a dual lithology, depth-dependent diffusion equation in stratigraphic simulation: Basin Research", 1992, vol. 4, pp. 133-146.
Rivenaes et al., "Impact of sediment transport efficiency on large-scale sequence architecture: Results from stratigraphic computer simulation", Basin Research, 1997, vol. 9, pp. 91-105.
Nordlund et al., "Formalizing geological knowledge; with an example of modelling stratigraphy using fuzzy logic", Journal of Sedimentary Research, 1996, vol. 66, pp. 689-698.
Nordlund, "Fuzzim: Forward stratigraphic modeling made simple", Computers & Geosciences, 1999, vol. 25, pp. 149-456.
Nordlund et al., "Stratigraphic modeling using common-sense rules", Numerical Experiments in Stratigraphy: Recent Advances in Stratigraphic and Sedimentologic Computer Simulations, 1999, vol. 62: Tulsa, SEPM special publication.
Granjeon et al., "Concepts and applications of a 3-D multiple litology, diffusive model in stratigraphic modeling", Numerical Experiments in Stratigraphy: Recent Advances in Stratigraphic and Sedimentologic Computer Simulations, 1999, vol. 62, Tulsa, SEPM special publication, pp. 197-210.
Wendebourg et al., "Sedimentary Process Simulation: A New Approach for Describing Petrophysical Properties in Three Dimensions for Subsurface Flow Simulations", Geologic Modeling and Mapping, 1996, pp. 1-25.
Tetzlaff et al., "Sedimentary Process Modeling: From Academia to Industry", Geological Modeling and Simulation, Sedimentary Systems, 2001, pp. 45-69.
Tetzlaff et al., "Interaction among sedimentation, compaction, and groundwater flow in coastal settings", GSA Special Paper 426, 2007.
Bitzer et al., "DEPOSIM: A Macintosh computer model for two-dimensional simulation of transport, deposition, erosion, and compaction of clastic sediments", Computers and Geosciences, 1987, vol. 13, pp. 611-637.
Gratacós et al., "SIMSAFADIM-CLASTIC: A new approach to mathematical 3D forward simulation modelling for terrigeneous and carbonate marine sedimentation", Geologica Acta, 2009, vol. 7, pp. 311-322.
Syvitsky et al., "2D SEDFLUX 1.0C: an advanced process-response numerical model for the fill of marine sedimentary basins", Computers & Geosciences, 2001, vol. 27, pp. 731-753.
Hutton et al.,"Sedflux 2.0: An advanced process-response model that generates three-dimensional stratigraphy", Computers & Geosciences, 2008, vol. 34, pp. 1319-1337.
Meijer et al.,"Modelling the drainage evolution of a river-shelf system forced by Quaternary glacio-eustasy", Basin Research, 2002, vol. 14, pp. 361-377.

(56) References Cited

OTHER PUBLICATIONS

Dalman et al.,"SimClast: An aggregated forward stratigraphic model of continental shelves", Computers and Geosciences, 2012, vol. 38, pp. 115-126.
Ritchie et al., "Three-dimensional numerical modeling of coarse-grained clastic deposition in sedimentary basins", Journal of Geophysical Research, 1999, vol. 104, pp. 17759-17780.
Sylvester et al.,"Stratigraphic evolution of intraslope minibasins: Insights form surface-based model", AAPG Bulletin, 2015, vol. 99, issue No. 6, pp. 1099-1129.

* cited by examiner

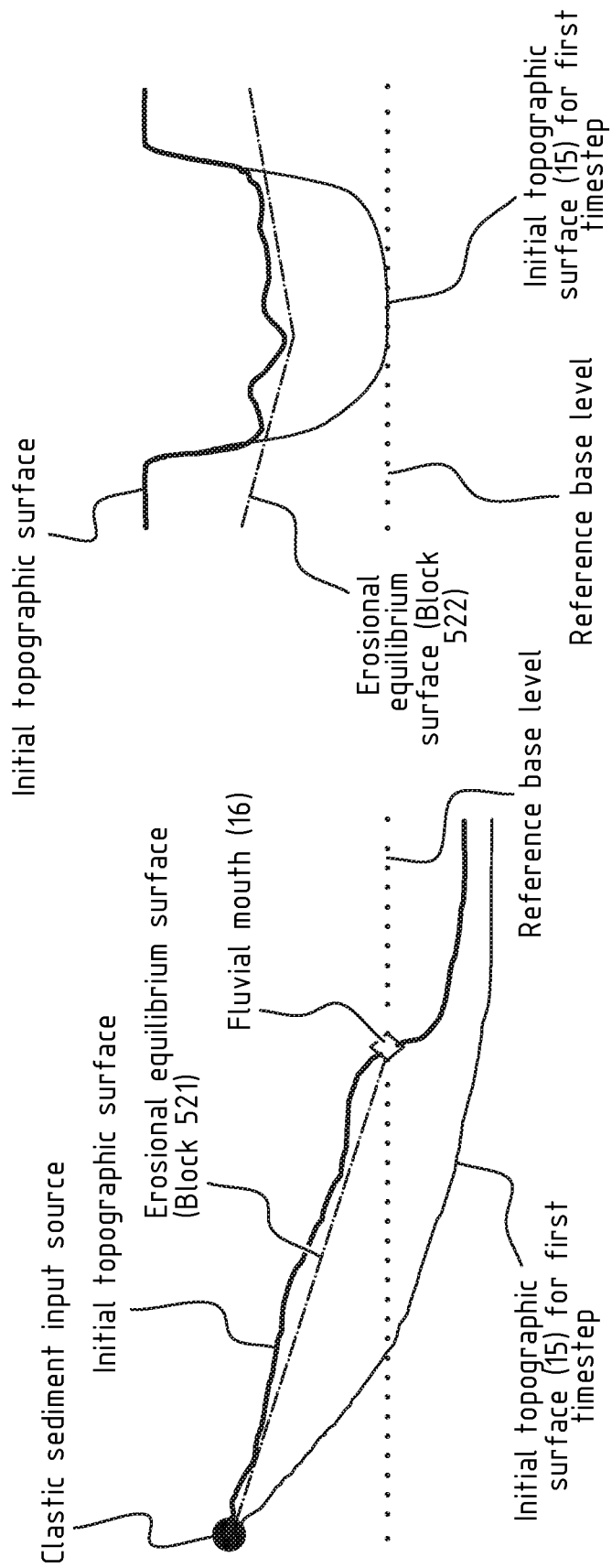

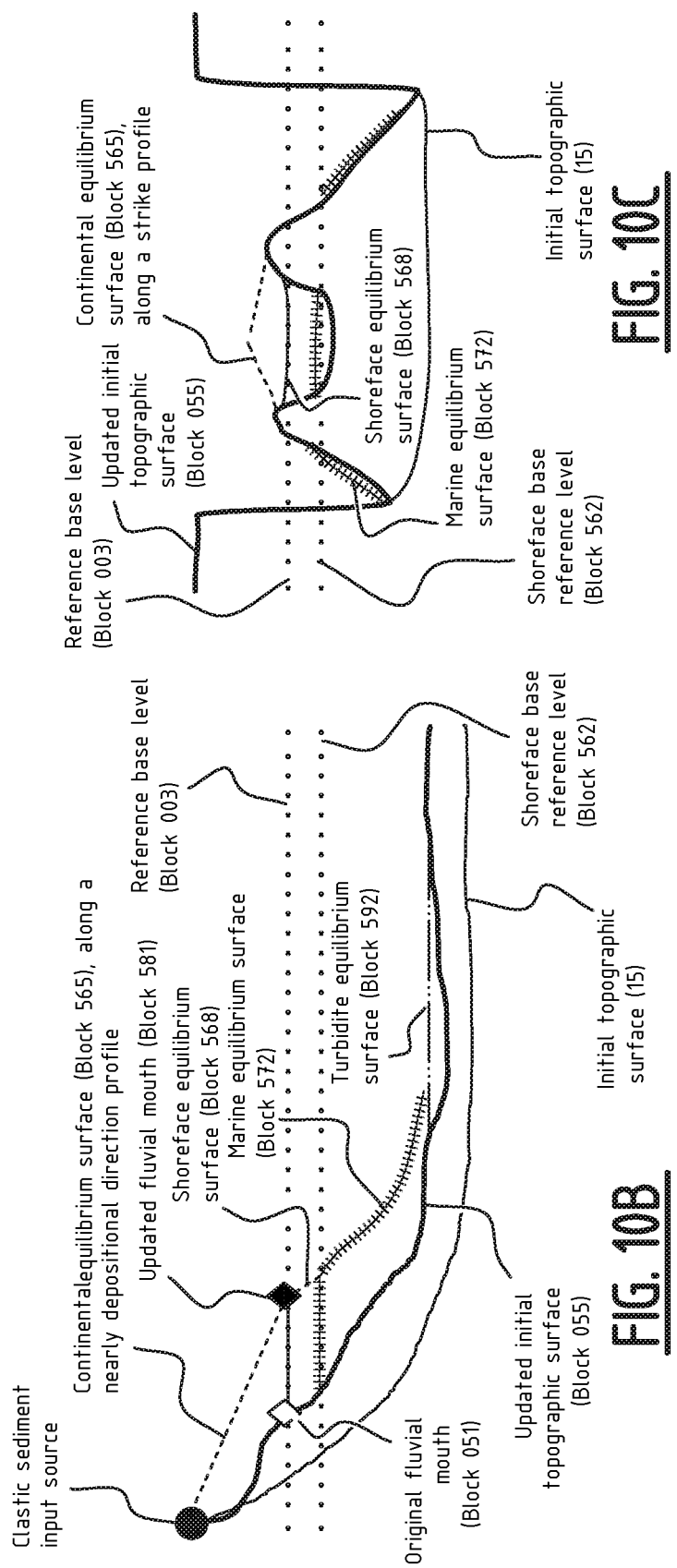

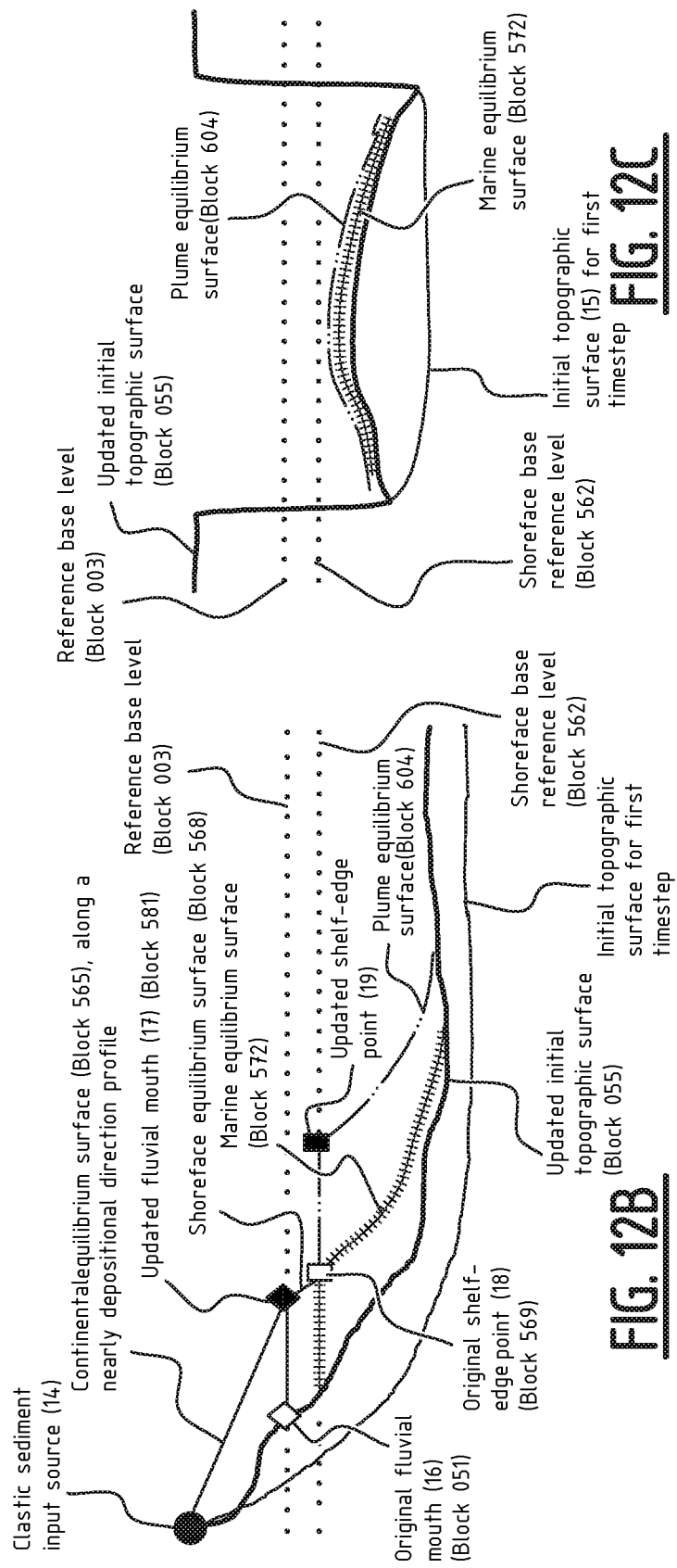

CONSTRUCTING STRATIGRAPHIC IMAGES OF SEDIMENT DISTRIBUTION IN A SUBSURFACE OF THE EARTH

CROSS REFERENCE TO RELATED APPLICATIONS

This is a Continuation Application of International Application No. PCT/US2018/021299, filed 7 Mar. 2018, which claims priority benefit of US Provisional Application No. 62/469,061, filed 9 Mar. 2017 and European Application No. 17162590.8, filed 23 Mar. 2017. The International Application is incorporated herein by reference.

FIELD OF THE INVENTION

In one aspect, the present disclosure relates to a method to identify a distribution of sand sediment class in a subsurface of the Earth. In another aspect, the present disclosure relates to a computer device programmed to construct stratigraphic images of sediment distribution in a subsurface of the Earth. The images are suitably used to identify a distribution of sand sediment class in the subsurface of the Earth suitable for producing hydrocarbons or fresh water, or for storing gas or liquids.

BACKGROUND OF THE INVENTION

Knowledge of the distribution of porous and non-porous, and permeable and non-permeable clastic sedimentary rocks in the subsurface is a longstanding technical problem in the industry of oil and gas production. Rocks with high porosity and high permeability can store valuable fluids in its pores that can be extracted or can be used to dispose gaseous substances. Therefore, several fields of industry benefit from finding these rocks in the subsurface, most notably the exploration and production of (mineral) hydrocarbons, the exploration and production of fresh water, and the subsurface storage of gas, such as carbon dioxide, and other fluids.

Clastic sedimentary rocks are usually made of sand or mud sediment. Rocks made of sand sediment (or sandstones) usually have higher porosity and permeability than rocks made of mud sediment (or mudstones). Therefore, sandstones are often considered targets for producing or storing fluids in its pores, whereas mudstones are avoided.

Since drilling wells is very costly, and provides only information on a very limited volume of the subsurface, geophysical prospecting techniques (such as gravimetry, magnetometry, or seismic) are usually applied during exploration before drilling to make predictions of the distribution of sandstones and mudstone rocks in the subsurface. These techniques may generate images of the subsurface such that optimal locations can be selected for drilling afterwards. Geophysical prospecting techniques provide a wider spatial coverage than drilling, but they usually provide ambiguous results due to the indirect nature of the measurements taken and their vertical resolution limitations. In order to reduce this ambiguity, complementary techniques may be used, among them building stratigraphic forward models (SFM).

Simulation of sediment transport and accumulation are generally the most complex part of a SEM. This derives from the fact that individual events responsible for transporting and accumulating the bulk of clastic sediment volumes (such as fluvial floods, storms, or turbidites) occur at temporal timescales around hours to days, and therefore several orders of magnitude below the scales used as timesteps in the SFM.

A variety of methods or combinations of different algorithms have been developed in recent years. Methods can generally be classified between two end-member strategies: Strategy 1) attempting to explicitly simulate the actual hydrodynamic processes that control sediment transport and deposition; and Strategy 2) attempting to directly simulate the results of sediment transport and deposition without explicitly simulating the processes.

Those methods that are close to Strategy 1) typically require extensive and complex descriptions of the physical processes. Moreover, the practical applicability of these methods is limited to models covering small areas and short timesteps, allowing only for testing a small number of scenarios compared to the requirements outlined above. This limits their applicability for subsurface prediction.

Belonging to Strategy 2) there are those methods that attempt to simulate directly the results of sediment transport and deposition for each individual timestep by a number of stratigraphic rules, without simulating the processes.

Some success has been achieved by methods that simulate a two-dimensional transect using equilibrium profiles (Strobel et al., 1989; Lawrence et al., 1990; Ross et al., 1995; Bowman and Vail, 1999). An equilibrium profile refers to the top of a genetically related sedimentary package resulting after sediment erosion and deposition occurred during a timestep. Such equilibrium profile can be defined for each depositional domain simulated in a single timestep in order to simulate multiple depositional domains. Such methods can only reproduce a sediment input point at each side of the transect, and cannot simulate the results of sediment transport occurring in a direction different than the modelled transect. As a consequence, these methods cannot really be used for predicting three-dimensional sediment distribution in most real basins. Instead, they have been used mostly in the past to illustrate the behavior of ideal basin transects under different controlling conditions.

Some methods extend the concept of equilibrium profiles to equilibrium surfaces to generate three-dimensional images. For example, the method by Ritchie et al., 1999 uses a TO single equilibrium surface for each timestep, with a single sediment source and a single sediment class to simulate the results of transport and deposition in the marine domain of deposition. The method by Sylvester et al., 2015 uses two equilibrium surfaces for each timestep, with a single sediment source and a single sediment class to simulate the results of transport and deposition in the turbidite depositional domain. Both of these methods were used to illustrate the behavior of specific depositional domains of an idealized basin under a variety of controlling parameters, but they are limited in their application to hydrocarbon exploration since they can only model a single environment of deposition and a single sediment input source.

As exploration for hydrocarbons is increasingly challenging, with a shift towards more remote and more complex areas (such as deep-water, mountain ranges, complex sediment distribution, deep burial or complex overburden), there is a need in the industry for improved subsurface sediment prediction methodologies and tools.

SUMMARY OF THE INVENTION

In a first aspect, there is provided a method to identify a distribution of sand sediment class in a subsurface of the Earth, comprising:

a) constructing three-dimensional stratigraphic images of sediment distribution in a subsurface of the Earth, including at least two depositional domains and at least two sediment classes; and b) using the images of sediment distribution to identify a distribution of sand sediment class in the subsurface of the Earth suitable for producing hydrocarbons or fresh water, or for storing gas or liquids.

The method may be a computer-based method.

Step a) may generally be performed by simulating sediment transport and deposition over a selected time interval of sediments originating from one or more clastic sediment input sources, comprising dividing the selected time interval into a sequence of timesteps, applying pre-determined stratigraphic rules in a selected timestep from said sequence of timesteps, wherein defining at least two equilibrium surfaces bounding the at least two depositional domains and at least two sediment classes in the selected timestep;

making updates to the equilibrium surfaces by accounting for sediment feed from the one or more clastic sediment input sources, erosion and deposition in accordance with mass-balance equality constraints in the amounts of each sediment class fed, eroded and deposited in all depositional domains; and advancing to a next timestep until the selected time interval has been simulated.

Step a) may specifically comprise:

i. dividing a selected time interval into a sequence of timesteps, wherein a selected timestep corresponds to an initial timestep of said sequence of timesteps;

ii. defining an initial topographic surface and a reference base level at the beginning of the selected timestep;

iii. defining locations of one or more clastic sediment input sources in the initial topographic surface, and a sequence of fluvial centerlines and their associated sediment volumes of two or more sediment classes, wherein a selected centerline corresponds to a first centerline of said timestep;

iv. defining at least two equilibrium surfaces that overlie the initial topographic surface and together delineate three-dimensional boundaries between two or more of the depositional domains;

v. defining a geographic distribution for relative amounts of each sediment class for each depositional domain based on the geometry of equilibrium surfaces;

vi. updating the geometry of the equilibrium surfaces resulting in an updated geometry, whereby a volume of sediment of each sediment class contained within the depositional domains is equal to the sum of eroded volume and the sediment volumes associated with the corresponding fluvial centerline for each sediment class, wherein for each location in the updated geometry there exists a shallowest equilibrium surface resulting from one of the depositional domains;

vii. constructing an updated topographic surface from the shallowest equilibrium surfaces in the updated geometry;

viii. repeating steps iv to viii for the sequence of fluvial centerlines defined in step iii, whereby using a next centerline in the sequence of centerlines as the selected centerline, and whereby using the updated topographic surface as the initial topographic surface;

ix. defining a timestep geographic distribution for the relative amount of each sediment class in the timestep by averaging the proportions of each sediment class in all depositional domains;

x. repeating steps ii-ix for the sequence of timesteps, whereby using a next timestep in the sequence of timestep defined in step i as the selected timestep and whereby using the updated topographic surface defined in step vii as the initial topographic surface; and xi. defining a three-dimensional stratigraphic image by the initial topographic surface of the initial timestep and the updated topographic surfaces of all timesteps and the timestep geographic distributions for the relative amount of each sediment class in each timestep.

Each of these sub-steps in step A) may be executed by a computer.

In a second aspect, there is provided a computer device programmed to construct three-dimensional stratigraphic images of sediment distribution of at least two sediment classes in a subsurface of the Earth, in at least two depositional domains, comprising computer-executable instructions to simulate sediment transport and deposition of one or more clastic sediment classes in the at least two depositional domains over a selected time interval as described for Step a) above. The three-dimensional stratigraphic images may be outputted on any suitable output device, including a computer monitor, a projector, a printer, or any other suitable output device, so that it can be used to identify a distribution of sand sediment class in the subsurface of the Earth suitable for producing hydrocarbons or fresh water, or for storing gas or liquids.

Once a distribution of sand sediment class in the subsurface of the Earth has been identified as being suitable for producing hydrocarbons or fresh water, or for storing gas or liquids, the method may further include producing the hydrocarbons or the fresh water from the sand sediment, or storing the gas or liquid in the sand sediment.

The invention may further provide a non-transitory computer readable medium comprising computer-readable code to program the computer device as described above.

BRIEF DESCRIPTION OF THE DRAWING

The invention will be further illustrated hereinafter by way of example only, and with reference to the non-limiting drawing comprising the following figures:

FIG. 7E shows a section of FIG. 7A along E-E;

FIG. 7F shows a section of FIG. 7A along line F-F;

FIG. 10B shows a section of FIG. 10A along line B-B;

FIG. 10C shows a section of FIG. 10A along line C-C;

FIG. 12B shows a section of FIG. 12A along line B-B; and

FIG. 12C shows a section of FIG. 12A along line C-C.

The figures are schematic in nature, and not to scale. Like reference numbers are used for like features.

DETAILED DESCRIPTION OF THE INVENTION

Figure 1:
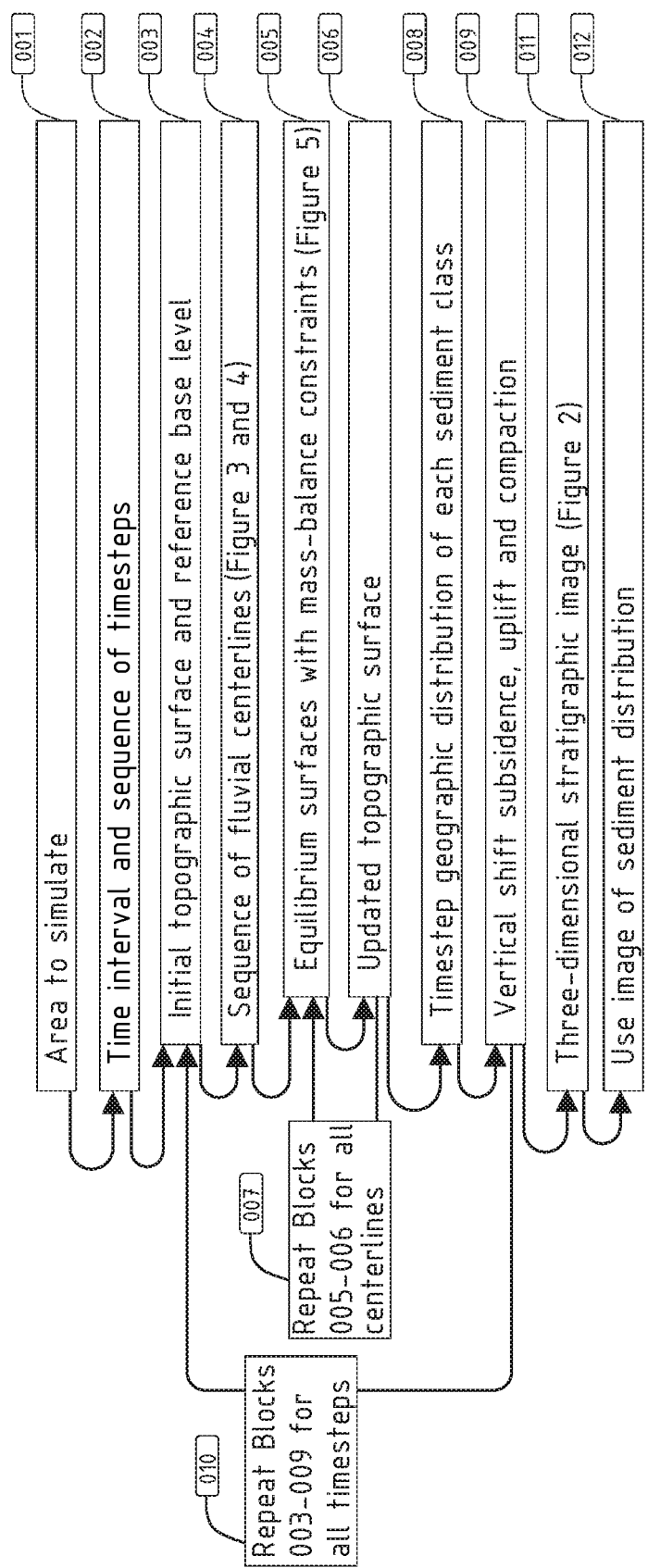
FIG. 1 is a process flow diagram showing a method to generate three-dimensional stratigraphic images of clastic sediment distribution.

The person skilled in the art will readily understand that, while the invention is illustrated making reference to one or more specific combinations of features and measures, many of those features and measures are functionally independent from other features and measures such that they can be equally or similarly applied independently in other embodiments or combinations.

Methods and computer devices are presently proposed to construct three-dimensional images of subsurface rock distribution with a stratigraphic forward model that uses an improved approach compared to any existing stratigraphic forward model described in the prior art as known to the inventors.

Results of sediment transport and deposition of at least two sediment classes in and from at least two depositional domains are simulated in 3D by stratigraphic rules, in a sequence of timesteps which together represent a simulated time interval. Depositional domains may include a selection comprising one or more of the group consisting of: plume; continental; shoreface; marine; turbidite. Additional depositional domains may be included. The sediment classes may distinguish between fine-grained sediments, such as mud and silt, and coarse-grained sediments, such as sand. At least two equilibrium surfaces per timestep are used. Equilibrium surfaces may correspond to those surfaces that constitute the top of a genetically-related sedimentary package resulting after erosion and sedimentation in a depositional domain during a timestep. The geometry of equilibrium surfaces may suitably be defined by the position of key geomorphological elements identified in the model, a set of geometrical parameters, and mass-balance constraints on the amount of each sediment class.

Suitably, the model may determine the geographic distribution for relative amounts of at least two sediment classes in each depositional domain, and in each timestep, by averaging the proportions of each sediment class in all depositional domains.

In each timestep a sequence of fluvial centerlines may be defined, with corresponding sediment volumes. The updating of the geometry of the equilibrium surfaces may further comprise that a volume of sediment of each sediment class contained within the depositional domains is equal to the sum of eroded volume and the sediment volumes associated with the corresponding fluvial centerline for each sediment class. Steps of the method may be repeated for the sequence of fluvial centerlines. This way, multiple environments of deposition (sediment classes) can be taken into account and the sediment transport can be conducted along multiple fluvial centerlines.

A special case is proposed wherein fluvial centerlines are specifically implemented, to connect a selection of clastic input sediment sources to fluvial mouths located at the shoreline; and erosional, continental, shoreface, marine, turbidite and plume depositional domains and related equilibrium surfaces are used.

The images of sediment distribution can be used to identify a distribution of porous sand sediment class in the subsurface for the purpose of producing or storing fluids in the subsurface. The images obtained with the proposed method show the distribution of at least two sediment classes in the subsurface.

The geomorphological elements identified in the model to construct the geometry of equilibrium surfaces may include a selection (or all) of: fluvial centerlines, fluvial mouths, shorelines, and shelf edges. The set of geometrical parameters may consist of parameters that can be easily measured in actual depositional domains analogous to those being modelled in the SFM. The geometry of the equilibrium surfaces is adjusted based on mass-balance constraints on the amount of each sediment class deposited. The generation of equilibrium surfaces covering multiple depositional domains involves non-trivial modifications to the original concepts behind equilibrium profiles in two-dimensional models referred to above.

A special case specifically implements fluvial centerlines to connect a specific selection of clastic input sediment sources to the shoreline. It then uses an erosional equilibrium surface to update the initial topography, and depositional equilibrium surfaces to delineate the boundaries of genetically-related sedimentary packages deposited in the continental, shoreface, marine, plume and turbidite depositional domains.

As example, a possible implementation will be described in detail of the special case with fluvial centerlines. In such implementation, three-dimensional stratigraphic images of sediment distribution in the subsurface of the Earth may be constructed by executing the following steps:

i. dividing a selected time interval into a sequence of timesteps, wherein a selected timestep corresponds to an initial timestep of said sequence of timesteps;

ii. defining an initial topographic surface and a reference base level at the beginning of the selected timestep;

iii. defining locations of one or more clastic sediment input sources in the initial T0 topographic surface, and a sequence of fluvial centerlines and their associated sediment volumes of two or more sediment classes, wherein a selected centerline corresponds to a first centerline of said timestep;

iv. defining at least two equilibrium surfaces that overlie the initial topographic surface and together delineate three-dimensional boundaries between two or more of the depositional domains;

v. defining a geographic distribution for relative amounts of each sediment class for each depositional domain based on the geometry of equilibrium surfaces;

vi. updating the geometry of the equilibrium surfaces resulting in an updated geometry, whereby a volume of sediment of each sediment class contained within the depositional domains is equal to the sum of eroded volume and the sediment volumes associated with the corresponding fluvial centerline for each sediment class, wherein for each location in the updated geometry there exists a shallowest equilibrium surface resulting from one of the depositional domains;

vii. constructing an updated topographic surface from the shallowest equilibrium surfaces in the updated geometry;

viii. repeating steps iv to viii for the sequence of fluvial centerlines defined in step iii, whereby using a next centerline in the sequence of centerlines as the selected centerline, and whereby using the updated topographic surface as the initial topographic surface;

ix. defining a timestep geographic distribution for the relative amount of each sediment class in the timestep by averaging the proportions of each sediment class in all depositional domains;

x. repeating steps ii-ix for the sequence of timesteps, whereby using a next timestep in the sequence of timestep defined in step i as the selected timestep and whereby using the updated topographic surface defined in step vii as the initial topographic surface; and xi. defining a three-dimensional stratigraphic image by the initial topographic surface of the initial timestep and the updated topographic surfaces of all timesteps and the timestep geographic distributions for the relative amount of each sediment class in each timestep.

These steps are suitably executed by a computer device programmed with computer-readable instructions corresponding to these steps. FIG. 1 is a process flow diagram showing an embodiment of the method to generate three-dimensional stratigraphic images of clastic sediment distribution, based on equilibrium surfaces and mass-balance constraints. The embodiment of the method comprises the following steps represented by Blocks:

Block 001: Defining an area of a sedimentary basin to simulate. Subdividing said area into a number of cells and nodes, which are the points in space on which subsequent computations are performed. The area may be relatively large (typically at least 10000 km²), with small grid cell dimensions (typically less than 100 km²).

Block 002: Defining a time interval in Earth's history, dividing said time interval into a sequence of timesteps, wherein a selected timestep corresponds to an initial timestep of said sequence.

Block 003: Defining an initial topographic surface and a reference base level at the beginning said selected timestep. The reference base level generally corresponds to sea level.

Block 004: Defining a sequence of fluvial centerlines, wherein a selected centerline corresponds to the initial centerline of said sequence.

Block 005: Defining the geometry of equilibrium surfaces for said selected fluvial centerline, which together with the initial topographic surface defined in Block 003, delineate three-dimensional boundaries between depositional domains; and defining the geographic distribution for the relative amount of each sediment class for each depositional domain based on the geometry of the equilibrium surfaces.

Block 006: Constructing an updated topographic surface as the shallowest equilibrium surface in the geometry of equilibrium surfaces defined in Block 005.

Block 007: Repeating Blocks 005-006 for the sequence of fluvial centerlines; whereby using a next centerline in the sequence of centerlines defined in Block 004 as the selected centerline and whereby using the updated topographic surface defined in Block 006 as the initial topographic surface.

Block 008: Defining a geographic distribution for the relative amount of each sediment class in the timestep by averaging the proportions of each sediment class in all depositional domains defined in Block 005.

Block 009: Optionally defining an updated position for said updated topographic surface defined in Block 006 of the present timestep and any previous timestep to account for subsidence, uplift and compaction of previous deposits as provided by user input.

Block 010: Repeating Blocks 003-009 for the sequence of timesteps defined in Block 002, whereby using a next timestep in the sequence as the selected timestep and whereby using the updated topographic surface defined in Block 006 as the initial topographic surface.

Block 011: Defining a three-dimensional stratigraphic image by the initial topographic surface of the first timestep and the updated topographic surfaces of all timesteps defined in Block 009 and said geographic distribution for the relative amount of each sediment class in each timestep defined in Block 008. The three-dimensional stratigraphic images may be outputted on any suitable output device, including a computer monitor, a projector, a printer, or any other suitable output device, so that it can be used to identify a distribution of sand sediment class in the subsurface of the Earth suitable for producing hydrocarbons or fresh water, or for storing gas or liquids.

Block 012: Using the image of sediment distribution defined in Block 011 to identify a distribution of sand and mud sediment classes in the subsurface for the purpose of at least one of hydrocarbon or fresh water exploration, or storage of gas in the subsurface of the Earth.

Figures 2A, 2B:
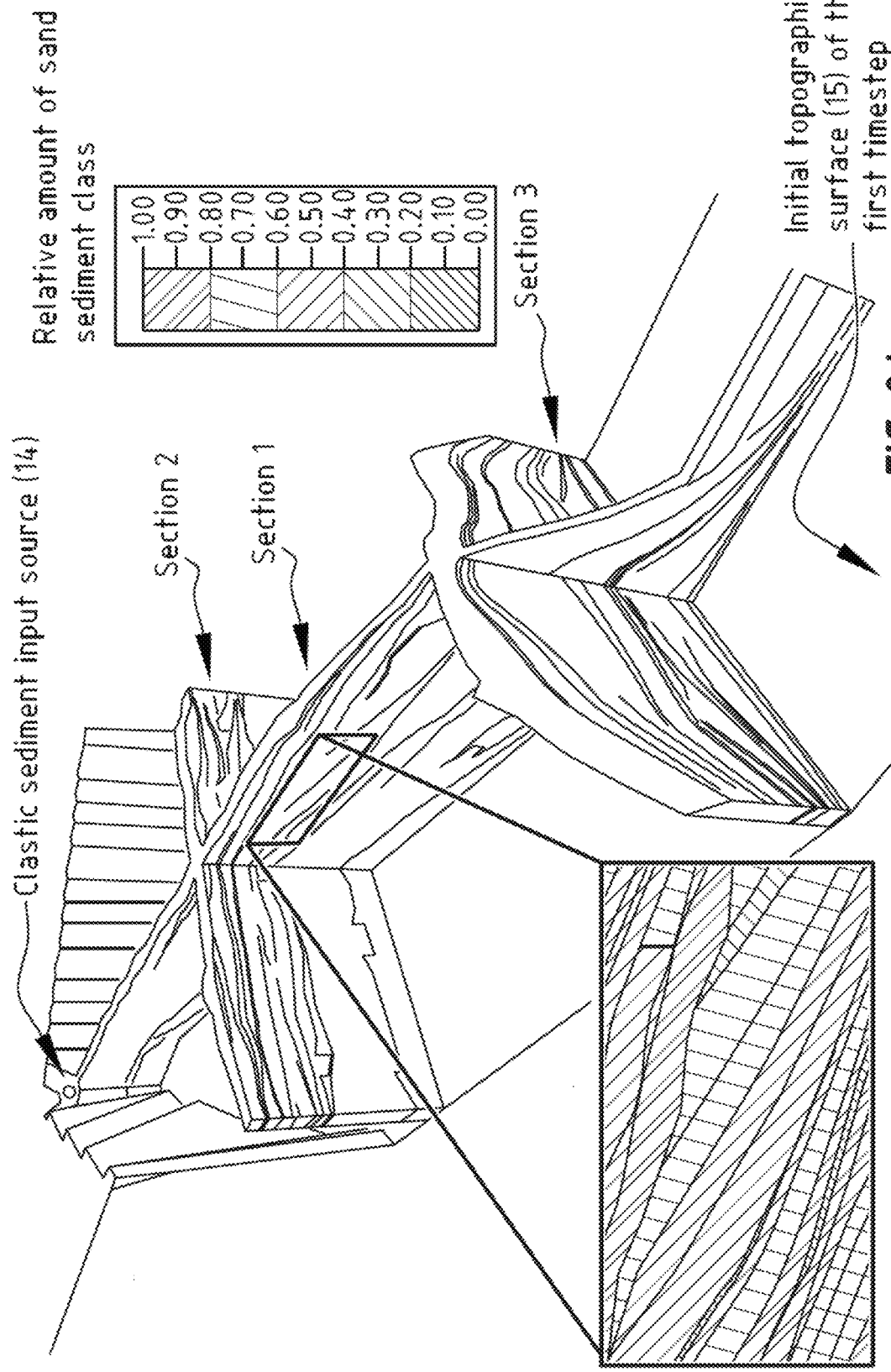
FIG. 2A is an illustration of a three-dimensional stratigraphic image as defined in Block 011 of FIG. 1.
FIG. 2B is a close up view of FIG. 2A.

FIG. 2A is an illustration of a three-dimensional stratigraphic image as obtained in Block 011 of FIG. 1. The three-dimensional image is viewed by means of the initial topographic surface 15 of the first timestep, and three sections (Section 1; Section 2; Section 3) that show the geographic distribution for the relative amount of sand sediment class in each timestep. One clastic sediment input source 14 is indicated at the top. FIG. 2B is a close-up view that shows the updated topographic surfaces of several timesteps as black lines.

Figure 3:
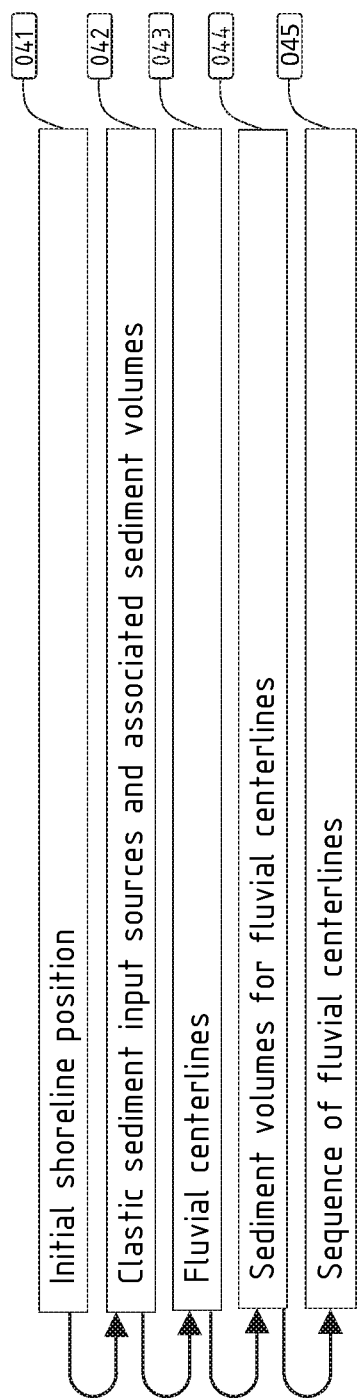
FIG. 3 is a process flow diagram showing a suggested method to obtain a sequence of fluvial centerlines referred to in Block 004 of FIG. 1.

Block 004 introduces a sequence of fluvial centerlines. This sequence of fluvial centerlines may be obtained in accordance with the process flow diagram of FIG. 3, which proposes steps as represented by Blocks:

Block 041: Defining an initial shoreline position as the vertical intersection of said initial topographical surface defined in Block 003 with said reference level elevation defined in Block 003.

Block 042: Defining the locations of at least one clastic input sediment source, and its associated volumes of sand and mud sediment classes.

Block 043: Defining at least one fluvial centerline for each said input sediment source defined in Block 042, as a series of points originating from the location of said input source and following down-dip directions over said initial topographic surface defined in Block 003 until reaching said initial shoreline defined in Block 041.

Block 044: Defining a sediment volume for each said fluvial centerline defined in Block 043 such that the sum of sediment volumes of fluvial centerlines associated with said sediment input source defined in Block 042 are equal to said sediment input volume associated with said sediment input source defined in Block 042.

Block 045: Defining a sequence for said fluvial centerlines defined in Block 043 based on the relative sediment volumes defined in Block 044.

Figure 4A:
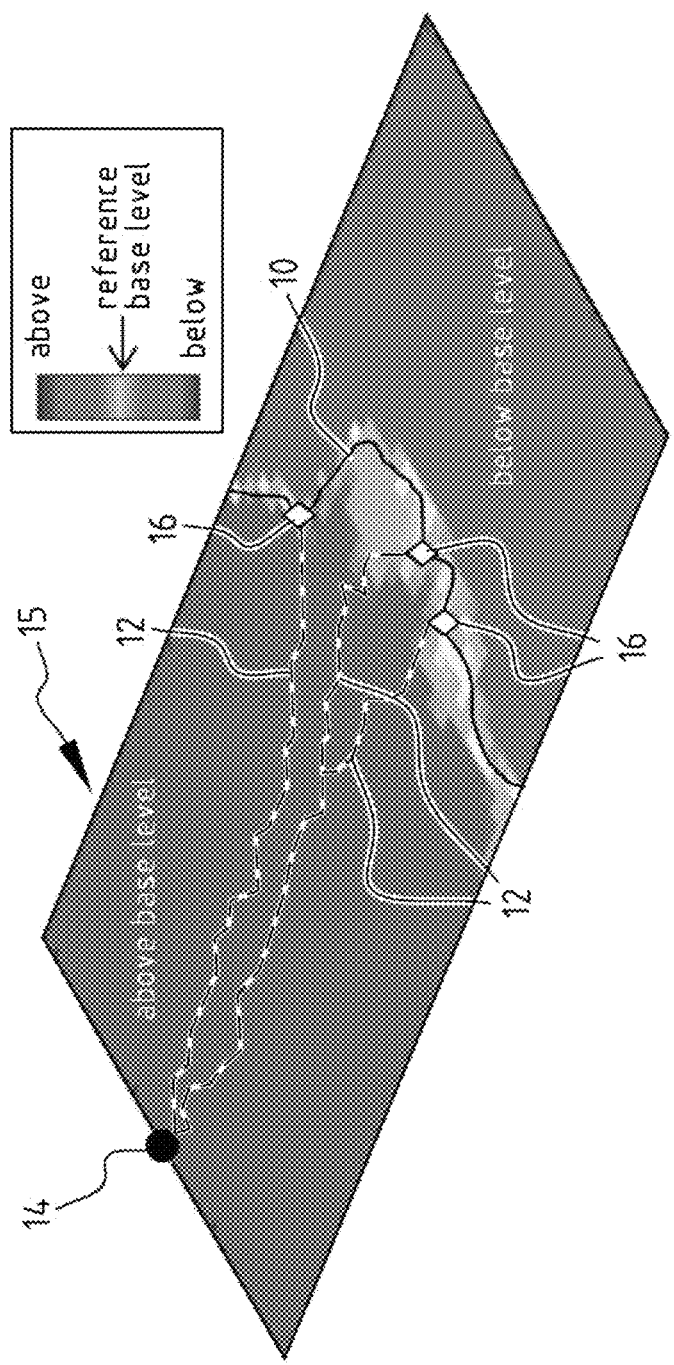
FIG. 4A is an illustration of one example with different elements involved in determining the position of fluvial centerlines.
Figure 4B:
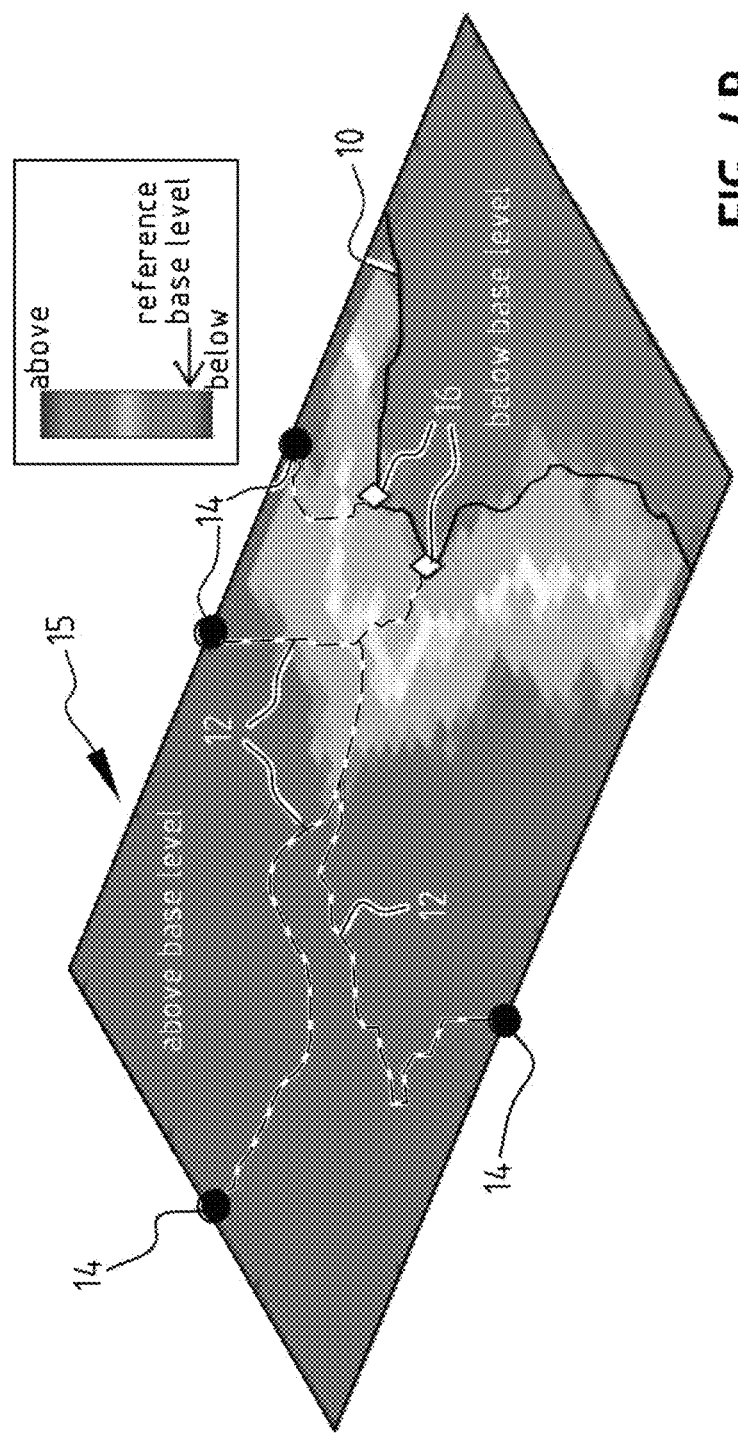
FIG. 4B is an illustration of another example with different elements involved in determining the position of fluvial centerlines.

Two different examples are illustrated in FIGS. 4A and 4B. Maps of the initial topographic surface 15 are represented by the grey shades. The grey-scale legend represents the elevations of the initial topographic surface 15. The position of the reference base level is indicated by an arrow at the grey-scale legend, and it is clearly indicated which parts are above base level and which parts are below base level. It should be noted that the reference base level can vary through different time steps as in the examples shown herein. The initial shoreline is represented by a continuous line 10, and the dashed lines 12 represent fluvial centerlines which connect one or more selected clastic sediment input sources 14 with one or more fluvial mouths 16. The position of fluvial centerlines 12 may be determined by the positions of the clastic sediment input sources 14 and the gradients.

Figure 5:
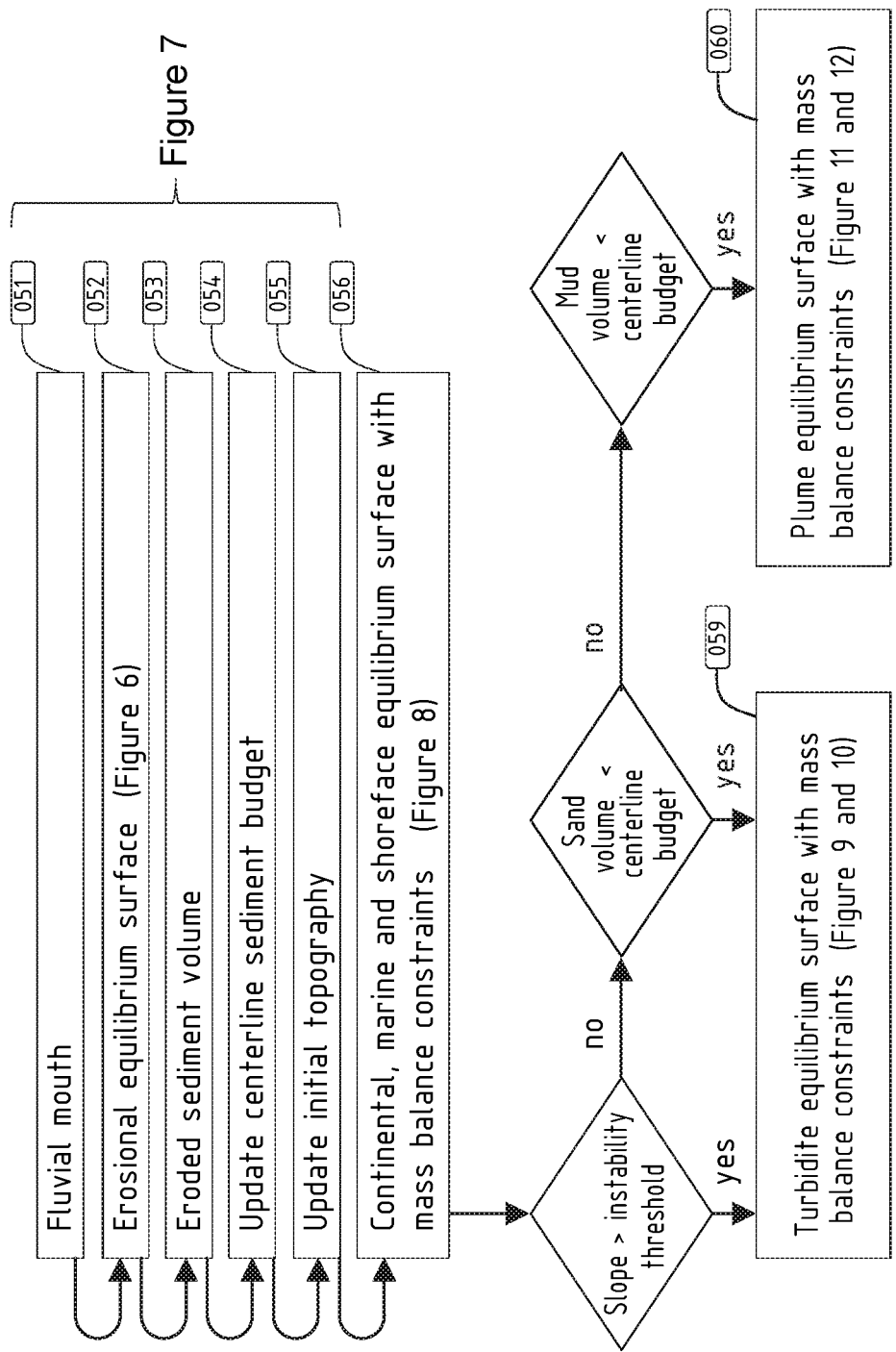
FIG. 5 is a process flow diagram showing a suggested method for obtaining the geometry of equilibrium surfaces.

FIG. 5 illustrates a suggested method for obtaining the geometry of equilibrium surfaces as set forth in in Block 005, for the selected fluvial centerline from the sequence of fluvial centerlines defined in Block 004. The suggested method takes into account mass-balance constraints. The Blocks of the suggested method represent steps as follows:

Block 051: Defining the fluvial mouth for said fluvial centerline defined in Block 004 as the point where the fluvial centerline reaches said initial shoreline defined in Block 041.

Block 052: Defining an erosional equilibrium surface.

Block 053: Defining the eroded sediment volume by computing the volume of sand and mud sediment classes that lie above said erosional equilibrium surface defined in Block 052 of any previous timesteps defined in Block 009 or previous centerlines within the timestep defined in Block 007.

Block 054: Updating said centerline sediment budget defined in Block 044 by adding the sum of eroded sand and mud sediment classes.

Block 055: Defining an updated initial topography by subtracting the sub-aerially eroded sediment volume defined in Block 053 from the initial topography defined in Block 003.

Block 056: Defining continental, marine and shoreface equilibrium surfaces and depositional domains. In geographic terms, the shoreface base level corresponds to the level below sea level in which effects of waves, tides, and atmospheric conditions are small enough to be neglectable. The shoreface base level determines the position of the top of the marine equilibrium surface (which corresponds to the base of the shoreface depositional domain). Above the shoreface base level is the shoreface depositional domain, which is typically rich in sand. Fine-grain sediments become more likely below the reference base level.

Block 059: If said updated fluvial mouth defined in Block 581 (see definition below) reaches a geographic location in which the slope of said initial topography is larger than a specified threshold, or said computed volume of the sand sediment class defined in Block 580 (see definition below) is lower than said centerline sediment budget defined in Block 054 then define a turbidite equilibrium surface.

Block 060: If said computed volume of mud sediment class defined in Block 580 (see definition below) is lower than said centerline sediment budget defined in Block 054 then define a plume equilibrium surface.

Figure 6:
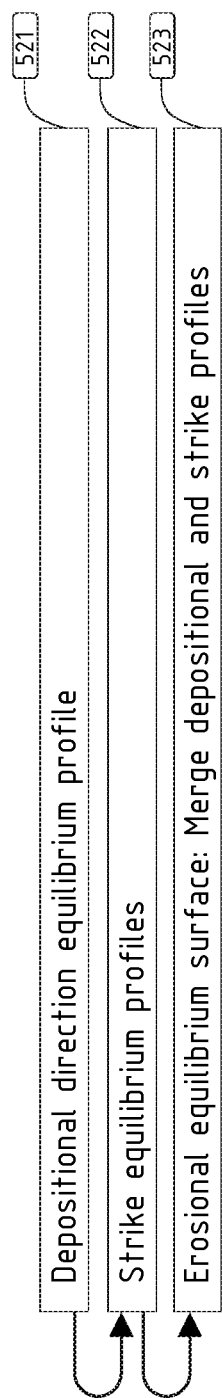
FIG. 6 is a process flow diagram showing a suggested method for obtaining the geometry of an erosional equilibrium surface.

Block 052 prescribes defining an erosional equilibrium surface. A suggested implementation is illustrated in FIG. 6, in which Block 521 represents defining a depositional direction equilibrium profile by specifying an updip profile originating at said fluvial mouth and defined at each point along said fluvial centerline. Block 522: Defining a strike erosional profile at each point of said depositional direction equilibrium profile in a direction orthogonal to said depositional direction equilibrium profile. Block 523: Defining the erosional equilibrium surface by merging all said strike profiles for said fluvial centerline.

Figure 7A:
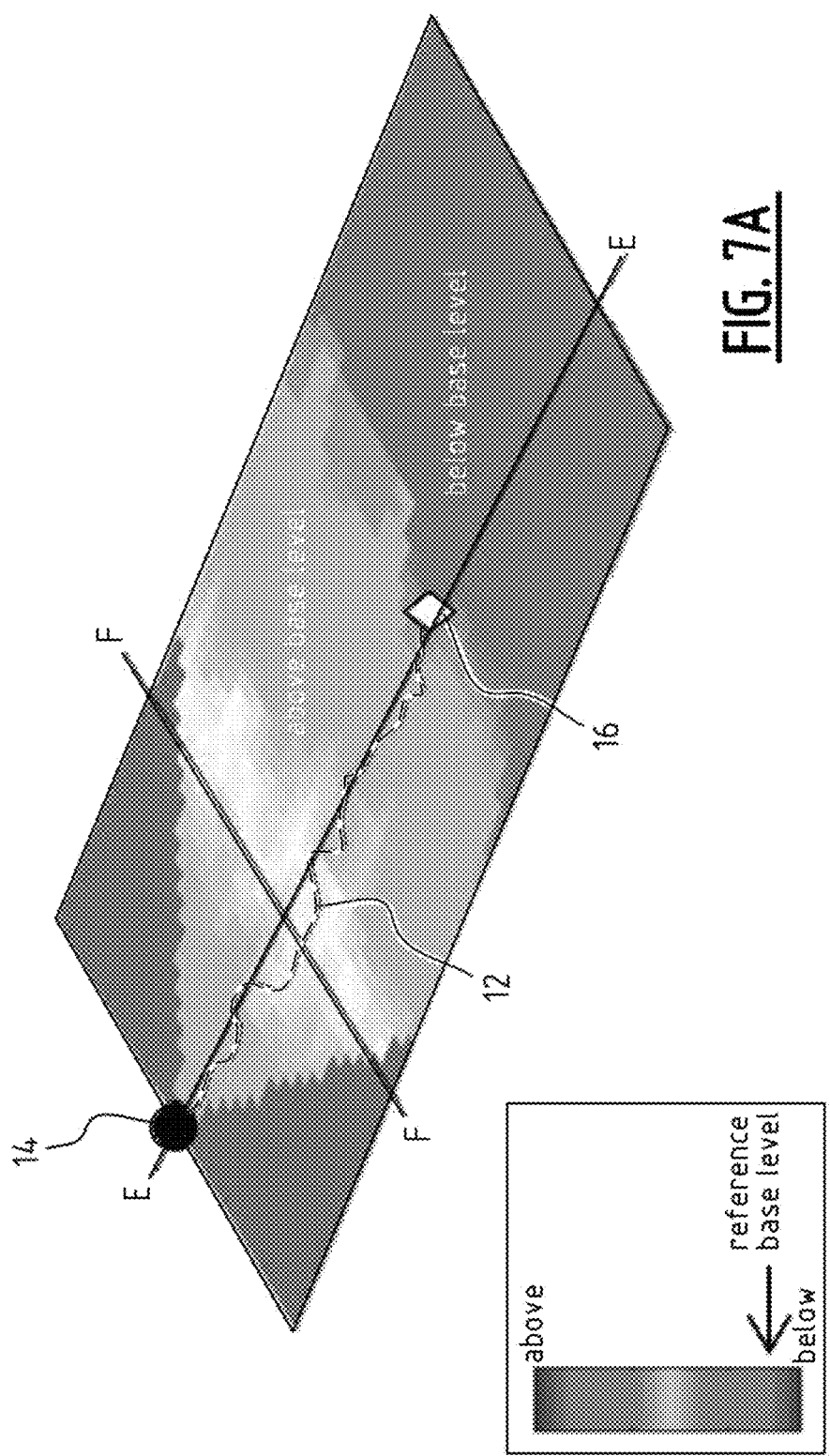
FIG. 7A shows a first map of the initial topographic surface as determined in Block 003 as an illustration of the different elements for obtaining and applying an erosional equilibrium surface for a specific centerline and timestep.
Figure 7B:
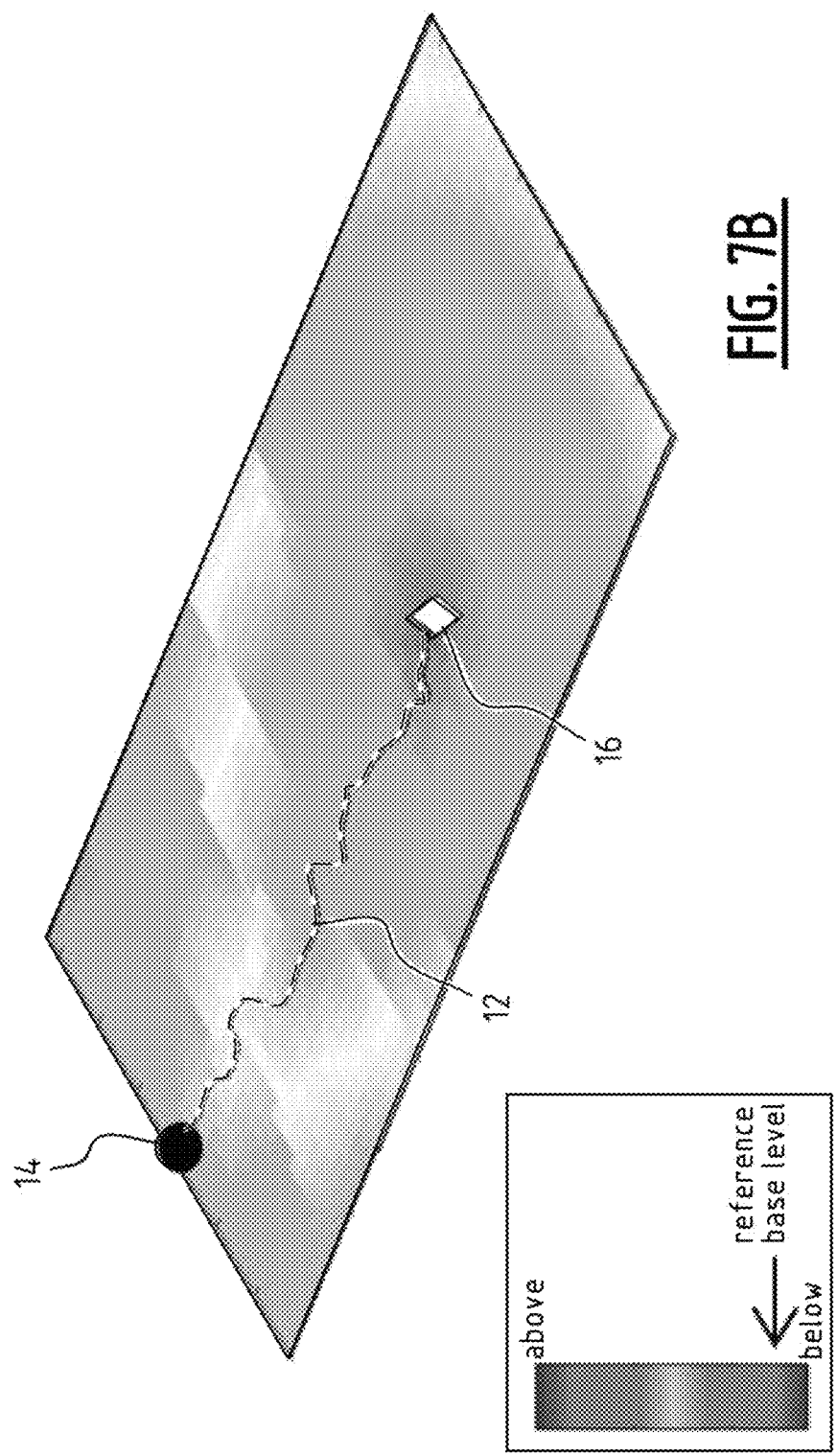
FIG. 7B shows a second map, associated with FIG. 7A, as determined by Block 052.
Figure 7C:
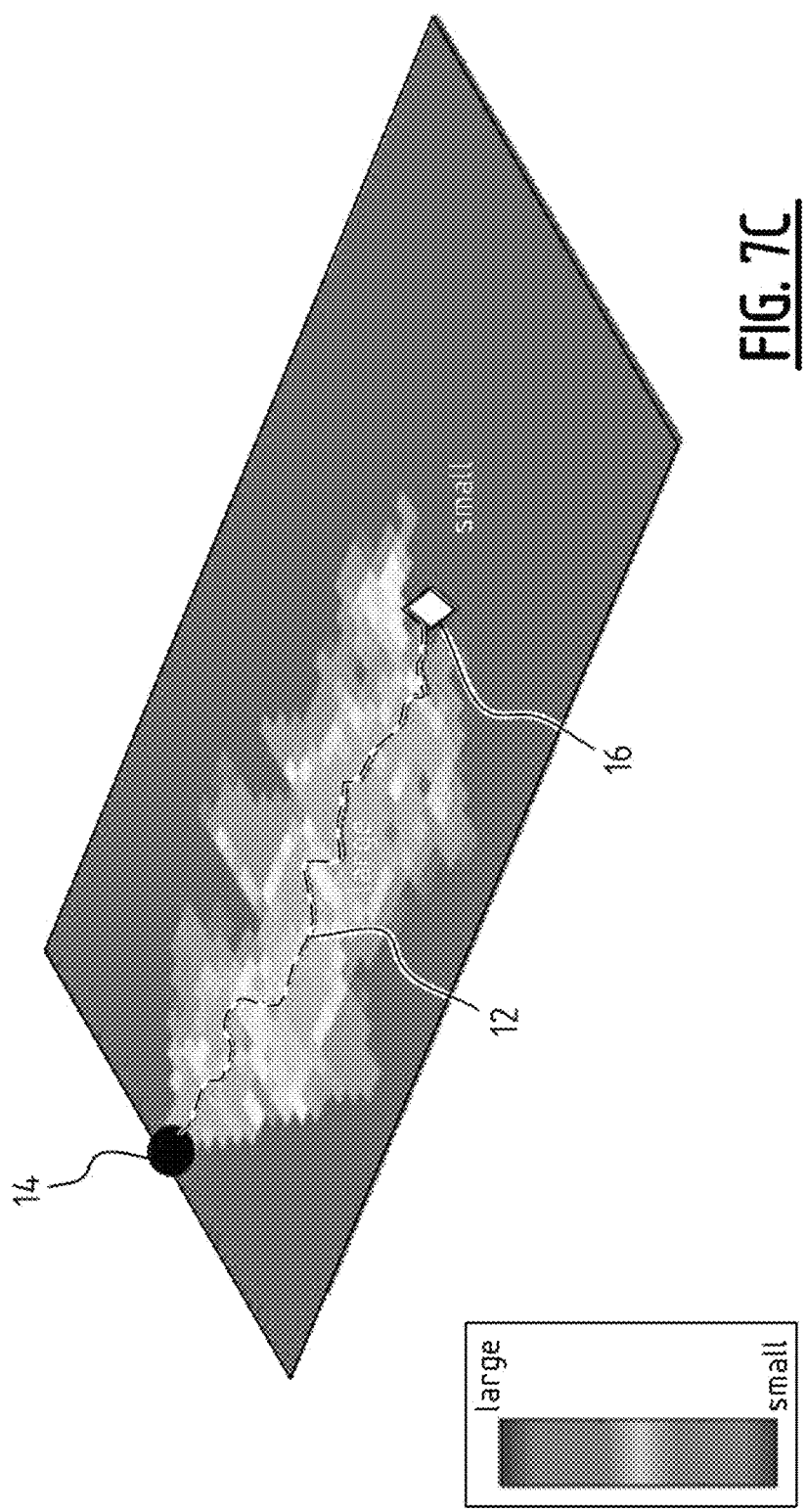
FIG. 7C shows a third map to illustrate Block 053.
Figure 7D:
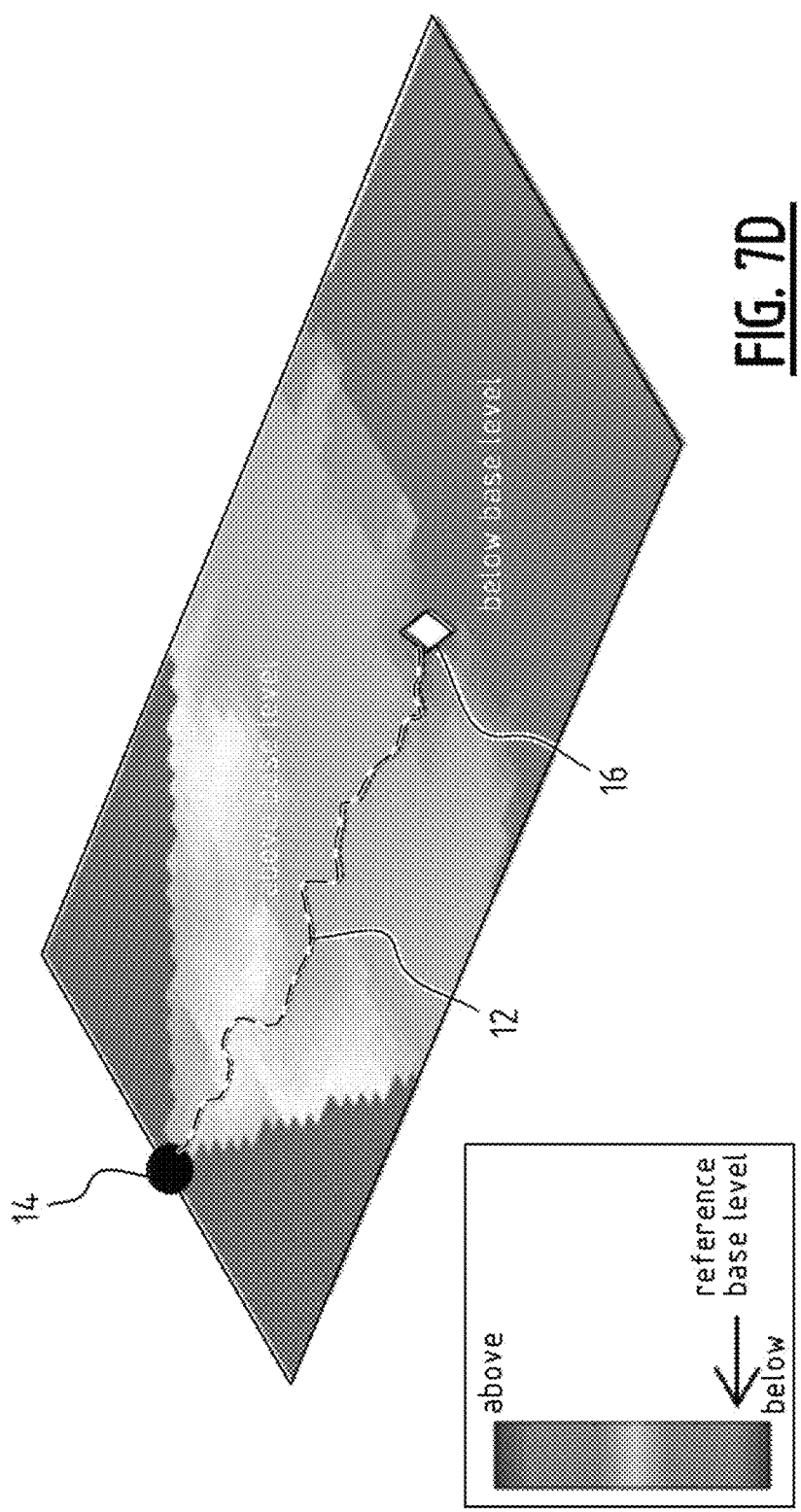
FIG. 7D shows a fourth map of an updated topography of Block 055.

The different elements for obtaining and using an erosional equilibrium surface for a specific fluvial centerline and timestep (Blocks 051-055 of FIG. 5) are illustrated in FIGS. 7A to 7F. FIG. 7A shows an elevation map with elevations of the initial topographic surface for a selected time step (grey shades) as determined in Block 003, and a fluvial centerline 12 connecting a selected sediment input source 14 with the original fluvial mouth 16 as determined in Block 051. The fluvial mouth 16 is at the reference base level. The position of the reference base level is indicated on the grey-scale bar. FIG. 7B shows an elevation map of the erosional equilibrium surface (in grey shades) associated with FIG. 7A, as determined in Block 052. Block 053 is illustrated in FIG. 7C, which shows a thickness map of eroded sediment. Gray scales correspond to eroded thicknesses. FIG. 7D illustrates an elevation map (grey shades) of the updated topography referred to in Block 055. FIG. 7E shows the initial topographic surface for the timestep of FIG. 7A along line E-E as indicated in FIG. 7A Line E-E is approximately parallel to the fluvial centerline 12—if desired a curvilinear section, following the true fluvial centerline 12, may be displayed instead. FIG. 7F shows the initial topographic surface for the timestep of FIG. 7A along line F-F as indicated in FIG. 7A (perpendicular to the fluvial centerline 12).

Figure 8:
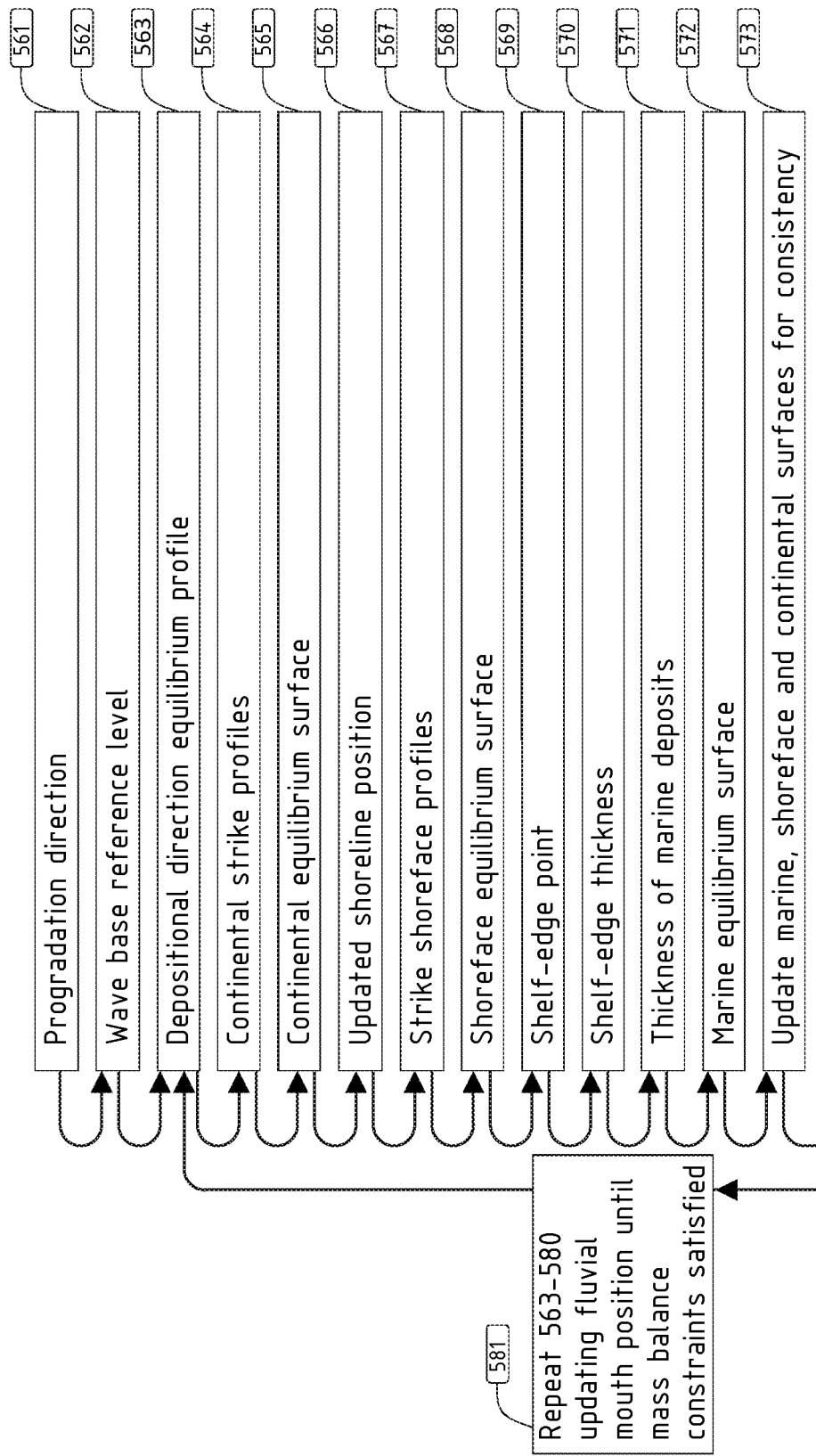
FIG. 8 is a process flow diagram showing a suggested method for obtaining a geometry of fluvial, shoreface and marine equilibrium surfaces.
Figure 8:
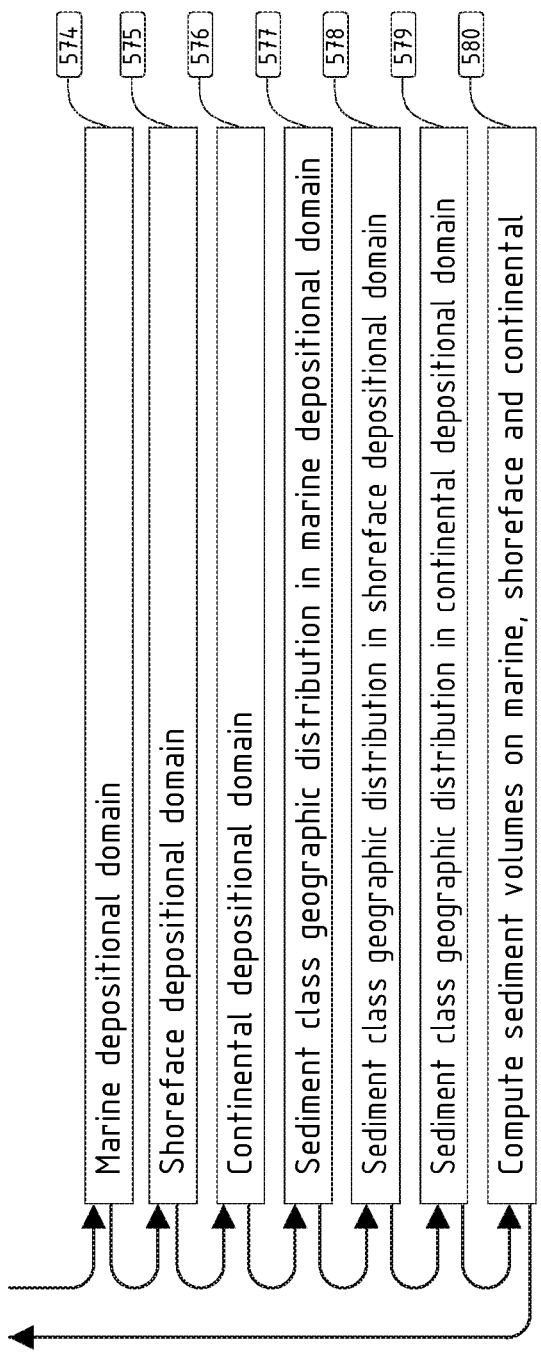

FIG. 8 is a process flow diagram showing a suggested method for obtaining a geometry of fluvial, shoreface and marine equilibrium surfaces with mass balance constraints as referred to in Block 056 of FIG. 5. The following explanations are provided for the Blocks of FIG. 8:

Block 561: Defining a progradation direction based on the geometry of said selected fluvial centerline defined in Block 043 or the geometry of said initial topography defined in Block 055.

Block 562: Defining a shoreface base reference level as a horizontal planar surface at an elevation lower than the reference base level defined in Block 003.

Block 563: Defining a depositional direction equilibrium profile by specifying an updip profile originating at said fluvial mouth defined in Block 051 and defined at each point along said fluvial centerline defined in Block 043.

Block 564: Defining continental strike profiles at each point of said depositional direction profile defined in Block 563 in a direction orthogonal to said depositional direction equilibrium profile, with a geometry such that the elevation of the strike profiles decreases with increasing distance to the depositional direction equilibrium profile.

Block 565: Defining the continental equilibrium surface by merging the depositional direction equilibrium profile defined in Block 563 and all said strike continental depositional profiles defined in Block 564.

Block 566: Defining the updated shoreline position by intersecting the continental equilibrium surface defined in Block 565 with the reference base level defined in Block 003.

Block 567: Defining strike shoreface profiles by extending each point of said new shoreline defined in Block 566 in a direction orthogonal to said shoreline, with a geometry such that the strike profile elevation decreases with increasing distance from the shoreline.

Block 568: Defining a shoreface equilibrium surface by merging all said strike shoreface profiles defined in Block 567, and resetting the elevation of the shoreface equilibrium surface to said elevation of the reference base level defined in Block 003 in locations in which said continental equilibrium surface defined in Block 565 is at a larger elevation than the reference base level in Block 003.

Block 569: Defining a shelf-edge point as the point obtained by projecting said fluvial mouth position following said strike shoreface profile defined in Block 567 along said progradation direction defined in Block 561, until intersecting an elevation equal to said shoreface base level defined in Block 562.

Block 570: Defining a shelf-edge thickness as the difference between the elevation of said shelf-edge point defined at Block 569, and the elevation of said initial topography defined in Block 055 at the same geographic position.

Block 571: Defining the thickness of the marine deposits as a function of the distance to said shelf-edge point defined in Block 569 and said shelf-edge thickness defined Block 570, such that the thickness decreases with increasing distance from the shelf-edge point.

Block 572: Defining the marine equilibrium surface by adding said thickness of marine deposits defined in Block 571 to the initial topography defined in Block 055.

Block 573: Updating said continental, shoreface and marine equilibrium surfaces defined in Blocks 565, 568 and 572 to ensure internal consistency between them; such that the initial topography defined in Block 055 is always at an elevation lower or equal to said marine equilibrium surface defined in Block 572, and said marine equilibrium surface is always at an elevation lower or equal than said shoreface equilibrium surface defined in Block 568, and said shoreface equilibrium surface is always at an elevation lower or equal than said continental equilibrium surface defined in Block 565.

Block 574: Defining the volume comprised between said initial topography defined in Block 055 and the updated marine equilibrium surface defined in Block 573 as the marine depositional domain.

Block 575: Defining the volume comprised between said marine equilibrium surface defined in Block 573 and said shoreface equilibrium surface defined in Block 573 as the shoreface depositional domain.

Block 576: Defining the volume comprised between said shoreface equilibrium surface defined in Block 573 and said fluvial equilibrium surface defined in Block 573 as the continental depositional domain.

Block 577: Defining the geographic distribution of sand and mud fraction in said marine depositional domain defined in Block 574.

Block 578: Defining the geographic distribution of sand and mud fraction in said shoreface depositional domain defined in Block 575.

Block 579: Defining the geographic distribution of sand and mud fraction in said continental depositional domain defined in Block 575.

Block 580: Computing the volumes of sand and mud by summing over the marine, shoreface and continental depositional domains defined in Blocks 577, 578 and 579.

Block 581: Repeating Blocks 563-580 by updating the position of said original fluvial mouth defined in Block 051 by adding fluvial centerline segments following said progradation direction defined in Block 561 until said computed volume of sand or mud sediment classes defined in Block 580 is equal to said updated centerline sediment budget of sand and mud sediment classes defined in Block 054, while said computed volume of the other sediment class defined in Block 580 is lower than said centerline sediment budget defined in Block 054 or the slope computed of said initial topography defined at Block 055 at said fluvial mouth position is larger than an instability threshold.

Figure 9:
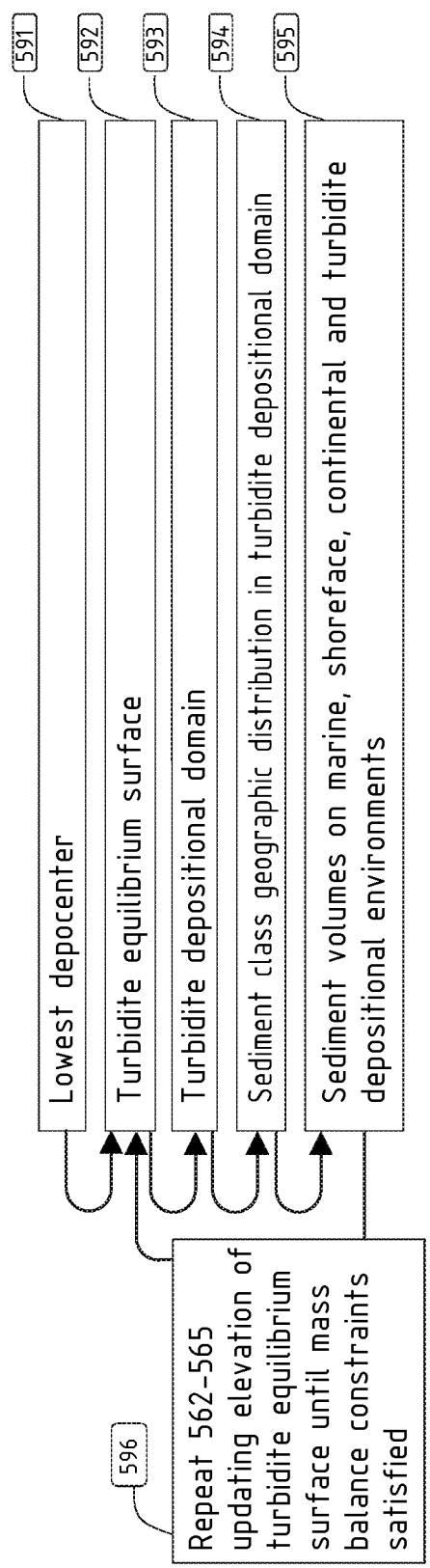
FIG. 9 is a process flow diagram showing a suggested method for obtaining a turbidite equilibrium surface.

FIG. 9 is a process flow diagram showing a suggested method for obtaining a turbidite equilibrium surface with mass balance constraints referred to in Block 059 of FIG. 5. The following explanations are provided for the Blocks in FIG. 9:

Block 591: Defining the lowest depocenter point as the geographic location that corresponds to the lowest elevation in said continental equilibrium surface defined in Block 573.

Block 592: Defining the turbidite equilibrium surface as a surface with the same elevation of said lowest depocenter point defined in Block 591.

Block 593: Defining the volume comprised between said continental equilibrium surface defined in Block 573 and said turbidite equilibrium surface defined in Block 592 as the turbidite depositional domain.

Block 594: Defining the geographic distribution of sand and mud sediment classes in the turbidite depositional domain as a constant with a relative sand sediment class proportion equal to the sand sediment class proportion left in the updated sediment centerline budget defined in Block 054 after subtracting the sand and mud sediment volumes in the continental, marine and shoreface depositional environments defined in Block 580.

Block 595: Defining the volumes of sand and mud by summing over the marine, shoreface, continental and turbidite depositional domains defined in Blocks 577, 578, 579 and 594.

Block 596: Repeating Blocks 591-595 by updating the elevation of said turbidite equilibrium surface defined in Block 591 until said computed volume of sand and mud sediment classes in Block 595 is equal to its said updated centerline sediment budget defined in Block 054.

Figure 10A:
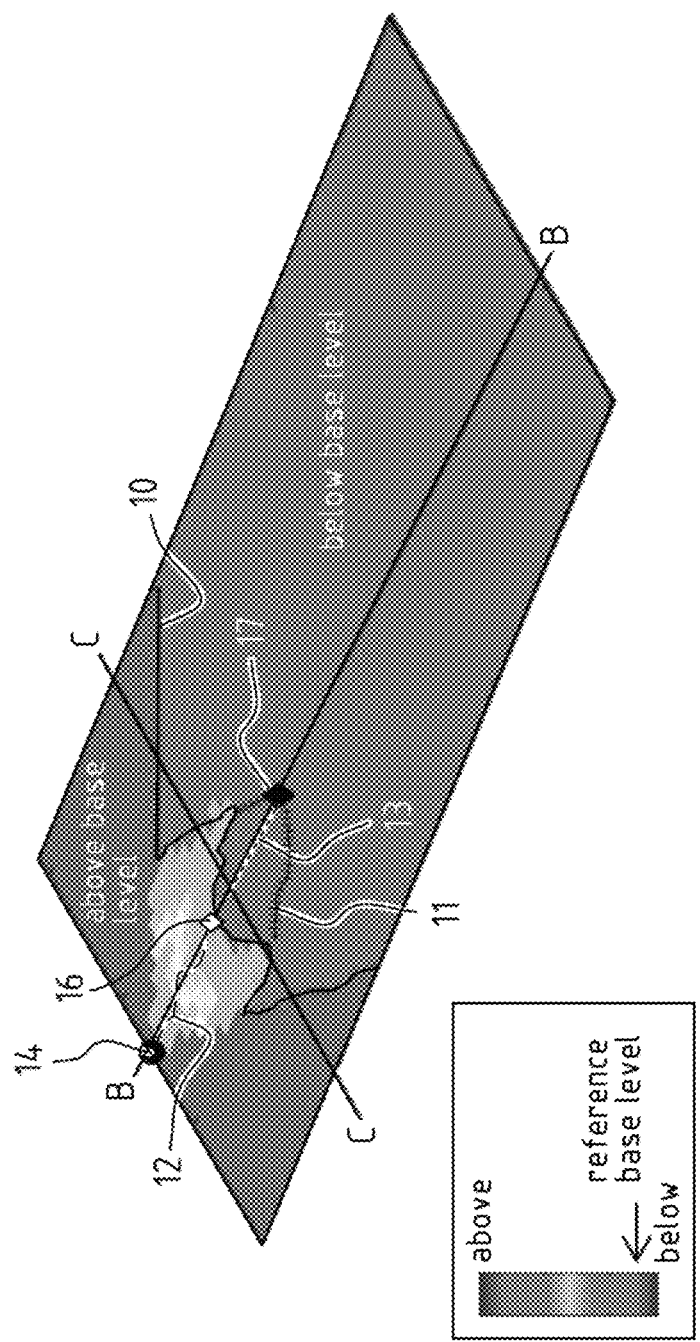
FIG. 10A shows a map illustrating the geometry of depositional equilibrium surfaces in a timestep that includes a turbidite, continental, shoreface and marine equilibrium surfaces.

FIGS. 10A to 10C illustrate the geometry of depositional equilibrium surfaces in a timestep that includes a turbidite, continental, shoreface and marine equilibrium surfaces, referred to in Blocks 056 and 059 of FIG. 5, FIG. 10A shows an elevation map (grey shades) of the initial topographic surface. in addition to the initial shoreline 10 and the initial fluvial mouth 16, the figure also shows an updated shoreline 11 and an updated fluvial mouth 17. The fluvial centerline 12 is extended with an additional fluvial centerline 13 consistent with the updated fluvial mouth 17. The additional fluvial centerline 13 is taken to be straight if the progradation direction is not changed when updating the fluvial mouth position. If desired a more realistic approach may be implemented wherein the progradation direction can change when updating, in which case the additional fluvial centerline may be curvilinear. FIG. 10B shows the initial and updated topographic surfaces of FIG. 10A along line B-B as indicated in FIG. 10A (approximately parallel to the fluvial centerline 12). FIG. 10C shows the initial and updated topographic surfaces of FIG. 10A along line C-C as indicated in FIG. 10A (perpendicular to the fluvial centerline 12). For clarity, when two or more equilibrium surfaces overlap each other, only the one that delimits the depositional domain that is immediately below it is shown.

Figure 11:
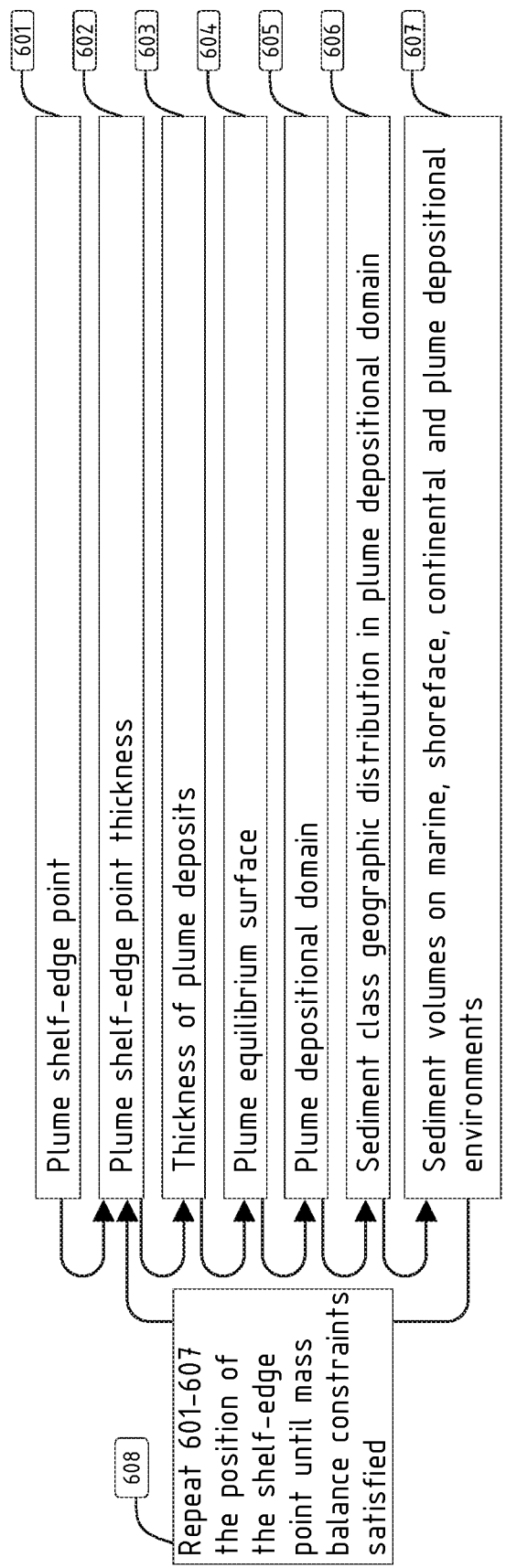
FIG. 11 is a process flow diagram showing a suggested method for obtaining a plume equilibrium surface.

A suggested method for obtaining a plume equilibrium surface (referred to in Block 060 of FIG. 5) using mass balance constraints is shown in the process flow diagram of FIG. 11. The following explanations are provided for the Blocks in FIG. 11:

Block 601: Defining the original position of the plume shelf-edge point as the position of said shelf-edge point defined in Block 569.

Block 602: Defining the plume shelf-edge thickness as the difference between the elevations of said plume shelf-edge point defined in Block 591, and the elevation of said continental equilibrium surface defined in Block 573 at the same geographic position.

Block 603: Defining the thickness of the plume deposits as a function of the distance to the plume shelf-edge point defined in Block 601 and the plume shelf-edge thickness defined in Block 602, such that the thickness decreases with increasing distance from the plume shelf-edge point.

Block 604: Defining the plume equilibrium surface by adding said thickness of the plume deposits defined in Block 603 to the continental equilibrium surface defined in Block 573.

Block 605: Defining the volume comprised between said continental equilibrium surface defined in Block 573 and said plume equilibrium surface defined in Block 603 as the plume depositional domain.

Block 606: Defining the geographic distribution of sediment classes in said plume depositional domain defined in Block 605 as being composed of only mud sediment class.

Block 607: Defining the volumes of sand and mud by summing over the marine, shoreface, continental and plume depositional domains defined in Blocks 577, 578, 579 and 606.

Block 608: Repeating Block 601-607 by updating modifying the position of the plume shelf-edge point defined in Block 601, until said computed volume of mud sediment class defined in Block 607 is equal to its said updated centerline sediment budget defined in Block 054.

Figure 12A:
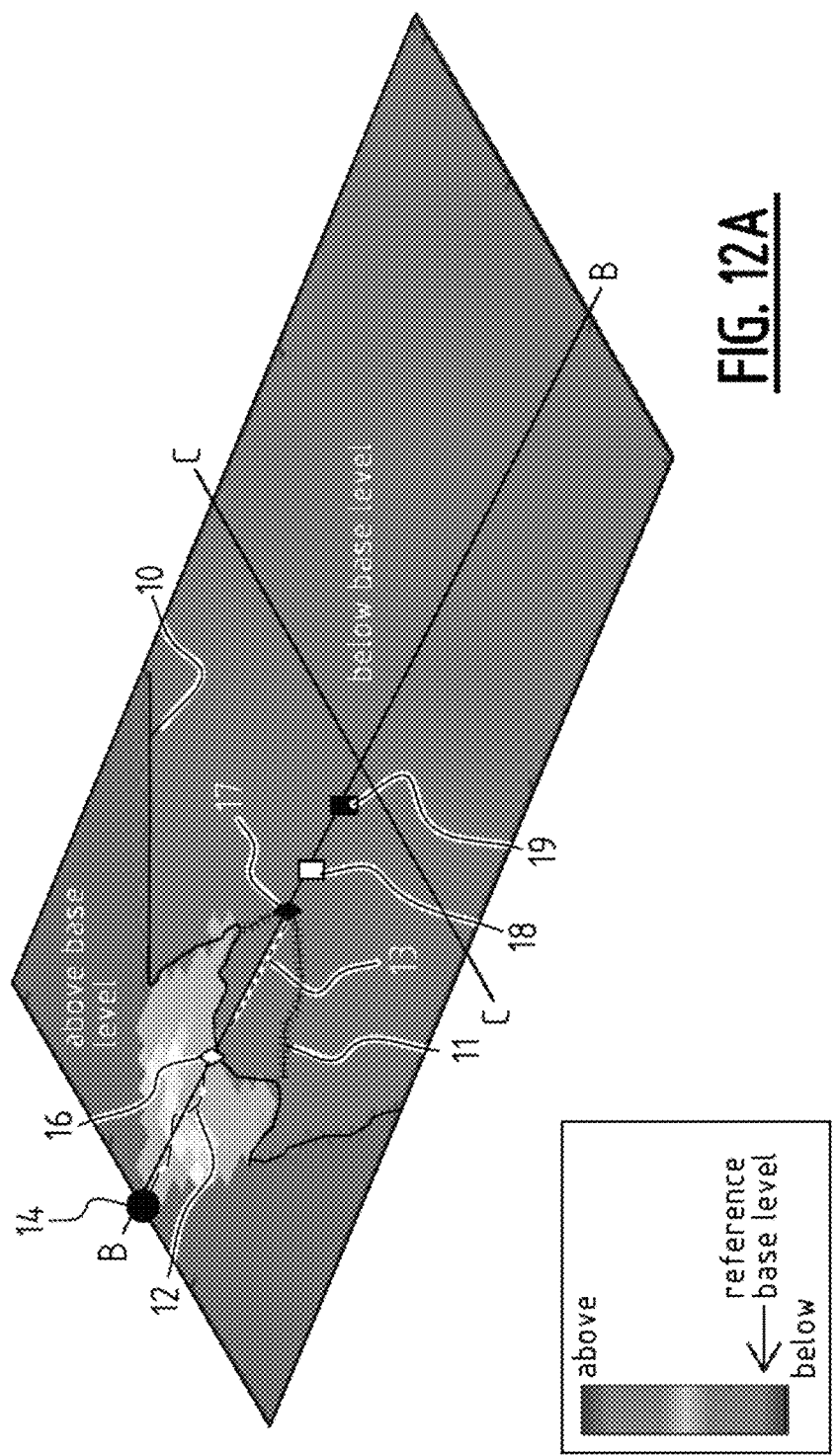
FIG. 12A shows a map illustrating the geometry of depositional equilibrium surfaces in a timestep that includes a plume, continental, shoreface and marine equilibrium surfaces.

FIGS. 12A to 12C illustrate the geometry of depositional equilibrium surfaces in a timestep that includes a plume, continental, shoreface and marine equilibrium surfaces, referred to in Block 056 and 060 of FIG. 5. The three panels FIGS. 12A to 12C show similar types of views as in FIGS. 10A to 10C. Similar to FIGS. 10A to 10C, when two or more equilibrium surfaces overlap each other, only the one that delimits the depositional domain that is immediately below it is shown (for clarity). FIG. 12A also shows the original self-edge point 18 and updated self-edge point 19.

The SFM method proposed herein is most akin to Strategy 2) approaches. Therefore, the application of this method is much more intuitive, simpler and faster compared to methods that employ Strategy 1) approaches. At the same time, the method proposed herein, does not suffer from limitations of previous methods as being limited to simulate two-dimensional transects or being limited to simulate one depositional domain or one sediment input source or one sediment class. This greatly enhances the capabilities for developing three-dimensional images of sediment distribution in real basins and efficiently evaluating multiple scenarios to understand the effects of uncertainty in boundary parameters.

SFM as described herein includes computer readable instructions to construct images of sediment distribution in a given sedimentary basin by simulating the geological processes that controlled sediment deposition in the past and therefore its current distribution. Generally, an interval of geologic time to be simulated is subdivided in a series of timesteps. Simulation starts from the oldest timestep and proceeds forward in time until the youngest. The area to be simulated may be subdivided in a series of cells arranged into a grid. Grid cell dimensions and the length of each timestep control the resolution of the images obtained. For each timestep the following processes are simulated:

Generation of accommodation space in the basin due to movements of the basin floor or compaction of underlying sediments.

Clastic sediment supplies to the basin usually defined at the boundaries of the model or by erosion of previous sediments stored inside the model.

Sediment transport and accumulation within the basin such that the same amount of clastic sediment supplied is redistributed inside the basin satisfying a mass-balance constraint.

In order for SFM to be useful for predicting sediment distribution for subsurface exploration, typically three-dimensional images are constructed over large areas (typically at least 10000 km$^2$) with small grid cell dimensions (typically less than 100 km$^2$), also spanning multiple depositional domains within a sedimentary basin, such as continental, shoreface, marine or open-marine. The models typically simulate significant amounts of geologic time (for example several thousand years to a few million years); such that images with thicknesses of tens to thousands of meters can be obtained.

Usually, many of the parameters controlling the processes that occurred in the past and that are simulated by the SFM are highly undetermined (such as sediment supply rates, or sediment supply composition, or positions in which sediment supply is introduced to the basin). Therefore, multiple scenarios (frequently tens to hundreds of thousands of scenarios) are tested to construct multiple images of subsurface rock distribution. These images are then analyzed within a probabilistic perspective to yield probabilities of occurrence for the distribution of sandstone and mudstone rocks. Patent publication U.S. Pat. No. 6,246,963; 6,754,588; and WO 2013/092663, describe methods of using a SFM to predict rock distribution in the subsurface by testing multiple scenarios. Computational efficiency and algorithm speed are therefore critical factors for applying SFM to predict rock distribution in the subsurface.

Due to the dimensions, duration, number of time steps, and number of models required, the amount and complexity of the calculations required by the algorithms in SFM models prevent them to be performed directly by humans, and instead these are embedded into a computer program.

The invention as described herein may be embodied in a computer device programmed to construct three-dimensional stratigraphic images of sediment distribution of at least two sediment classes in a subsurface of the Earth, in at least two depositional domains. The computer readable instructions by which the computer device is programmed may specifically include code representing steps i to xi defined above, It will further be understood that the invention further provides a non-transitory computer readable medium comprising computer-readable instructions that implement any of the embodiments described herein, to construct three-dimensional stratigraphic images of sediment distribution of at least two sediment classes in a subsurface of the Earth, in at least two depositional domains. The computer readable instructions may specifically include code representing steps i to xi defined above.

The person skilled in the art will understand that the present invention can be carried out in many various ways without departing from the scope of the appended claims.

REFERENCES

Bowman and Vail, 1999="Interpreting the sequence stratigraphy of the Baltimore canyon section, offshore New Jersey with PHIL, a stratigraphic simulator" in Numerical Experiments in Stratigraphy: Recent Advances in Stratigraphic and Sedimentologic Computer Simulation, Vol. 62 (1999), Tulsa, SEPM Special Publications;

Lawrence et al., 1990="Stratigraphic simulation of sedimentary basins—concepts and calibrations" in AAPG Bull, Vol. 74 (1990), pp. 273-295;

Ritchie et al., 1999="Three-dimensional numerical modeling of coarse-grained deposition in sedimentary basins" in Journal of Geophysical Research, Vol. 104 (1999), pp. 17759-17780;

Ross et al., 1995="Insights from stratigraphic modeling; mud-limited versus sand-limited depositional systems: AAPG Bulletin, Vol. 79 (1995), p. 231-258;

Strobel et al., 1989="Interactive (SEDPAK) simulation of clastic and carbonate sediments in shelf to basin settings" in Computers and Geosciences Vol. 15 (1989), pp. 1279-1290;

Sylvester et al., 2015="Stratigraphic evolution of intraslope minibasins: Insights form surface-based model" in AAPG Bulletin, Vol. 99-6 (2015), pp. 1099-1129.

What is claimed is:

1. A method to identify a distribution of sand sediment class in a subsurface of the Earth, comprising:
   a) constructing three-dimensional stratigraphic images of sediment distribution in a subsurface of the Earth with a stratigraphic forward model (SFM), including at least two depositional domains and at least two sediment classes; and
   b) using the three-dimensional stratigraphic images of sediment distribution constructed by simulation to identify a distribution of sand sediment class in the subsurface of the Earth suitable for producing hydrocarbons or fresh water, or for storing gas or liquids;
   wherein step a) comprises simulating the sediment distribution and deposition using the stratigraphic forward model (SFM), including the following sub-steps:
   i. dividing a selected time interval into a sequence of timesteps, wherein a selected timestep corresponds to an initial timestep of said sequence of timesteps;
   ii. defining an initial topographic surface and a reference base level at the beginning of the selected timestep;
   iii. defining locations of one or more clastic sediment input sources in the initial topographic surface, and a sequence of fluvial centerlines and their associated sediment volumes of two or more of the at least two sediment classes, wherein a selected centerline corresponds to a first centerline of said timestep;
   iv. defining at least two equilibrium surfaces that overlie the initial topographic surface and together delineate three-dimensional boundaries between two or more of the at least two depositional domains;
   v. determining a geographic distribution for relative amounts of each of the at least two sediment classes for each of the at least two depositional domains based on the geometry of equilibrium surfaces;
   vi. producing an updated geometry by updating the geometry of the equilibrium surfaces, wherein a volume of sediment of each of the at least two sediment classes contained within the at least two depositional domains is equal to the sum of eroded volume and the sediment volumes associated with the corresponding fluvial centerline for each of the at least two sediment classes, wherein for each location in the updated geometry there exists a shallowest equilibrium surface resulting from one of the depositional domains;
   vii. constructing an updated topographic surface from the shallowest equilibrium surfaces in the updated geometry;
   viii. repeating steps iv to vii for the sequence of fluvial centerlines defined in step iii, using a next centerline in the sequence of centerlines as the selected centerline, and using the updated topographic surface as the initial topographic surface;
   ix. determining a timestep geographic distribution for the relative amount of each of the at least two sediment classes in the timestep by averaging the proportions of each of the at least two sediment classes in the at least two depositional domains;
   x. repeating steps ii-ix for the sequence of timesteps, using a next timestep in the sequence of timestep defined in step i as the selected timestep and using the updated topographic surface constructed in step vii as the initial topographic surface; and
   xi. constructing the three-dimensional stratigraphic images from the initial topographic surface of the initial timestep and the updated topographic surfaces of all timesteps and the timestep geographic distributions for the relative amount of each of the at least two sediment classes in each timestep.

2. The method of claim 1, in which an initial shoreline is defined by an intersection of said initial topographic surface of step ii and said reference base level of step ii, and an updated shoreline is defined by the intersection of said updated topographic surface of step vii and said reference base level of step ii.

3. The method of claim 2 in which said fluvial centerlines follow a down-dip trajectory along said initial or updated topographic surface of step ii connecting one of said clastic sediment input sources of step iii with said initial shoreline or updated shoreline.

4. The method of claim 3 in which input clastic sediment volumes associated to each of said clastic input sediment sources are distributed amongst all said fluvial centerlines associated to that clastic sediment input source of step iii.

5. The method of claim 4 in which fluvial mouth locations are defined at the intersections between said fluvial centerlines of step iii and said initial shoreline or updated shoreline.

6. The method of claim 5 in which at least one equilibrium surface of step iv is an erosional equilibrium surface, whereby said erosional equilibrium surface is defined by the combination of an erosional dip profile originating at said fluvial mouth locations and defined along the fluvial centerline of step iii and strike erosional profiles originating at the erosional dip profile.

7. The method of claim 5 in which at least one of the equilibrium surfaces of step iv is a continental equilibrium surface, whereby said continental equilibrium surface is defined by the combination of a depositional dip profile originating at said fluvial mouth location and defined along the fluvial centerline of step iii and strike depositional profiles originating at the depositional dip profile.

8. The method of claim 7 in which the updated shoreline is computed by the intersection between said continental equilibrium surface and said reference base level of step ii.

9. The method of claim 5 in which at least one of the equilibrium surfaces of step iv. is a shoreface equilibrium surface, whereby the shoreface equilibrium surface is defined by merging shoreface profiles originating at said updated shoreline.

10. The method of claim 5 in which at least one equilibrium surface of step iv is a marine equilibrium surface, whereby said marine equilibrium surface is defined by computing a thickness of the marine deposits as a function of a distance from a shelf-edge point, the shelf-edge point being defined by projecting said fluvial mouth location following said shoreface equilibrium profiles until intersecting a specific elevation below said reference base level, and adding said thickness of the marine deposits to said initial topography.

11. The method of claim 5 in which additional equilibrium surfaces of step iv for additional sediments are included for at least one additional depositional domain.

12. The method of claim 11, wherein said at least one dispositional domain comprises at least one selected from the group consisting of plume depositional domain, and turbidite depositional domain.

13. The method as claimed in claim 1 in which the sediment classes correspond to fine-grained sediments and coarse-grained sediments, and in which geographic distributions of step v for the relative proportion of said fine versus said coarse grained sediments in each defined depositional domain are set using at least one of the following rules: a) constant, b) based on the distance to the fluvial centerline, or c) based on the distance to the updated shoreline.

14. The method as defined in claim 1, comprising: further updating the updated topographic surface of step x, and any previously updated topographic surfaces of previous timesteps, to account for variations representative of subsidence, uplift or compaction.

15. A computer device programmed to construct three-dimensional stratigraphic images of sediment distribution of at least two sediment classes in a subsurface of the Earth, in at least two depositional domains, comprising computer-executable instructions to perform the sub-steps as defined in claim 1.

16. A method to identify a distribution of sand sediment class in a subsurface of the Earth, comprising:
   a) constructing three-dimensional stratigraphic images of sediment distribution in a subsurface of the Earth with a stratigraphic forward model (SFM), including at least two depositional domains and at least two sediment classes; and
   b) using the three-dimensional stratigraphic images of sediment distribution constructed by simulation to identify a distribution of sand sediment class in the subsurface of the Earth suitable for producing hydrocarbons or fresh water, or for storing gas or liquids; and
   wherein step a) comprises simulating sediment transport and deposition using the stratigraphic forward model (SFM) over a selected time interval of sediments originating from one or more clastic sediment input sources, comprising simulating the sediment distribution and deposition using the stratigraphic forward model (SFM), including dividing the selected time interval into a sequence of timesteps, applying pre-determined stratigraphic rules in a selected timestep from said sequence of timesteps, wherein
   defining at least two equilibrium surfaces bounding the at least two depositional domains and at least two sediment classes in the selected timestep; and
   making updates to the equilibrium surfaces by accounting for sediment feed from the one or more clastic sediment input sources, erosion and deposition in accordance with mass-balance equality constraints in the amounts of each sediment class fed, eroded and deposited in all depositional domains; and advancing to a next timestep until the selected time interval has been simulated.

17. The method of claim 16, wherein each selected clastic sediment input source is connected to one or more of the depositional domains by fluvial centerlines.

18. A computer device programmed to construct three-dimensional stratigraphic images of sediment distribution of at least two sediment classes in a subsurface of the Earth with a stratigraphic forward model (SFM), in at least two depositional domains, comprising computer-executable instructions to simulate sediment transport and deposition of one or more clastic sediment classes in the at least two depositional domains over a selected time interval in accordance with step a) of claim 16.

19. The computer device of claim 18, further comprising an output device configured to output three-dimensional stratigraphic images, for further usage to identify a distribution of sand sediment class in the subsurface of the Earth suitable for producing hydrocarbons or fresh water, or for storing gas or liquids.

\* \* \* \* \*

UNITED STATES PATENT AND TRADEMARK OFFICE
CERTIFICATE OF CORRECTION

PATENT NO.        : 11,163,093 B2
APPLICATION NO.   : 15/978943
DATED             : November 2, 2021
INVENTOR(S)       : Oriol Falivene Aldea et al.

Page 1 of 1

It is certified that error appears in the above-identified patent and that said Letters Patent is hereby corrected as shown below:

In the Specification

In Column 1, Line 61, delete "SEM." and insert -- SFM. --, therefor.

In Column 2, Line 42, before "single" delete "TO".

In Column 6, Line 57, before "topographic" delete "TO".

In Column 10, Line 28, delete "FIG. 7A" and insert -- FIG. 7A. --, therefor.

In Column 12, Line 47, delete "in" and insert -- In --, therefor.

In Column 14, Line 55, delete "above," and insert -- above. --, therefor.

In the Claims

In Column 17, Line 15, in Claim 12, delete "dispositional" and insert -- depositional --, therefor.

Signed and Sealed this
Eighteenth Day of January, 2022

Drew Hirshfeld
*Performing the Functions and Duties of the*
*Under Secretary of Commerce for Intellectual Property and*
*Director of the United States Patent and Trademark Office*